US012628570B2

(12) United States Patent
van der Straten et al.

(10) Patent No.: US 12,628,570 B2
(45) Date of Patent: May 12, 2026

(54) BEVELED MAGNETO-RESISTIVE RANDOM ACCESS MEMORY PILLAR STRUCTURE

(71) Applicant: International Business Machines Corporation, Armonk, NY (US)

(72) Inventors: Oscar van der Straten, Guilderland Center, NY (US); Chih-Chao Yang, Glenmont, NY (US); Praneet Adusumilli, Somerset, NJ (US)

(73) Assignee: International Business Machines Corporation, Armonk, NY (US)

( * ) Notice: Subject to any disclaimer, the term of this patent is extended or adjusted under 35 U.S.C. 154(b) by 545 days.

(21) Appl. No.: 17/808,642

(22) Filed: Jun. 24, 2022

(65) Prior Publication Data

US 2023/0422630 A1 Dec. 28, 2023

(51) Int. Cl.
*H10N 50/80* (2023.01)
*H10N 50/01* (2023.01)
*H10N 50/85* (2023.01)

(52) U.S. Cl.
CPC ............. *H10N 50/80* (2023.02); *H10N 50/01* (2023.02); *H10N 50/85* (2023.02)

(58) Field of Classification Search
CPC ........ H10N 50/10; H10N 50/80; H10N 50/01; H10B 61/00
USPC ....................................................... 257/263
See application file for complete search history.

(56) References Cited

U.S. PATENT DOCUMENTS

| | | | |
|---|---|---|---|
| 8,305,711 B2 | 11/2012 | Li | |
| 8,334,093 B2 | 12/2012 | Zhang | |
| 8,455,965 B2 | 6/2013 | Li | |
| 8,520,337 B1 | 8/2013 | Liu | |
| 8,625,340 B1 * | 1/2014 | Mani ...................... | H10B 61/00 365/171 |
| 8,644,063 B2 | 2/2014 | Li | |
| 8,705,205 B1 | 4/2014 | Li | |
| 9,818,935 B2 | 11/2017 | Chuang | |
| 11,139,341 B2 | 10/2021 | Liu | |
| 11,171,284 B2 * | 11/2021 | Liao ....................... | H10N 50/10 |
| 12,170,162 B2 * | 12/2024 | Roiz-Wilson ....... | H01F 10/3254 |
| 2015/0056722 A1 | 2/2015 | Li | |
| 2020/0343299 A1 * | 10/2020 | Hsu ........................ | H10N 50/01 |
| 2021/0288242 A1 * | 9/2021 | Yogendra ............... | H10N 50/10 |
| 2022/0406991 A1 * | 12/2022 | Prabhu Gaunkar ..... | H01L 23/13 |
| 2023/0180622 A1 * | 6/2023 | Motoyama ............. | H10B 61/00 257/421 |
| 2023/0189657 A1 * | 6/2023 | Chuang .................. | H10N 50/01 257/421 |

(Continued)

*Primary Examiner* — Jami Valentine Miller
(74) *Attorney, Agent, or Firm* — Scott Dobson

(57) ABSTRACT

A memory device includes a magnetic tunnel junction pillar located between, and electrically connected to, a bottom electrode and a top electrode. The magnetic tunnel junction pillar is composed of a plurality of device layers vertically stacked above the bottom electrode. Each of the plurality of device layers, the top electrode, and the bottom electrode is formed at a first bevel angle. A bottommost portion of each of the plurality of device layers in the magnetic tunnel junction pillar has a width that is greater than a width of a topmost portion of each preceding device layer. An encapsulation layer is disposed along opposite sidewalls of the top electrode, opposite sidewalls of the bottom electrode, and opposite sidewalls of each of the plurality of device layers.

16 Claims, 15 Drawing Sheets

(56) References Cited

U.S. PATENT DOCUMENTS

| | | | | |
|---|---|---|---|---|
| 2023/0403944 | A1* | 12/2023 | van der Strate | ....... H10N 50/80 |
| 2023/0422630 | A1* | 12/2023 | van der Straten | ..... H10N 50/80 |
| 2024/0180045 | A1* | 5/2024 | van der Straten | ..... H10N 50/80 |
| 2025/0204268 | A1* | 6/2025 | van der Straten | ..... H10N 50/85 |

* cited by examiner

100

100

100

100

100

100

BEVELED MAGNETO-RESISTIVE RANDOM ACCESS MEMORY PILLAR STRUCTURE

BACKGROUND

The present invention generally relates to the field of magnetic storage devices, and more particularly to high performance magneto-resistive random access memory devices.

Magneto-resistive random access memory (MRAM) is a non-volatile random access memory technology in which data is stored by magnetic storage elements. These magnetic storage elements are typically formed from two ferromagnetic plates, each of which can hold a magnetization, separated by a thin dielectric layer, i.e., the tunnel barrier. One of the two plates is a permanent magnet set to a particular polarity; the other plate's magnetization can be changed to match that of an external field to store memory. Such configuration is known as a magnetic tunnel junction (MTJ) pillar.

For high performance MRAM devices based on perpendicular MTJ pillars, well-defined interfaces and interface control are essential. Embedded MTJ pillar structures are usually formed by patterning of blanket MTJ stacks. After MTJ stack patterning, the inter-pillar spaces are filled with an interlevel dielectric (ILD) to enable connection to back-end-of-line (BEOL) wiring by a top contact level. However, voids may form in the ILD between top electrodes and top contact metals. During deposition of the top contact material, the contact material may fill the voids resulting in electric shorts. Thus, there is a need for improved designs and techniques that can prevent voids during ILD deposition.

SUMMARY

According to an embodiment of the present disclosure, a memory device includes a magnetic tunnel junction pillar located between, and electrically connected to, a bottom electrode and a top electrode, the magnetic tunnel junction pillar including a plurality of device layers vertically stacked above the bottom electrode, each of the plurality of device layers, the top electrode, and the bottom electrode being at a first bevel angle, a bottommost portion of each of the plurality of device layers in the magnetic tunnel junction pillar having a width that is greater than a width of a topmost portion of each preceding device layer, and an encapsulation layer disposed along opposite sidewalls of the top electrode, opposite sidewalls of the bottom electrode, and opposite sidewalls of each of the plurality of device layers.

According to another embodiment of the present disclosure, a method of forming a memory device, includes forming a magnetic tunnel junction pillar between, and electrically connected to, a bottom electrode and a top electrode, the magnetic tunnel junction pillar including a plurality of device layers vertically stacked above the bottom electrode, each of the plurality of device layers, the top electrode, and the bottom electrode being at a first bevel angle, a bottommost portion of each of the plurality of device layers in the magnetic tunnel junction pillar having a width that is greater than a width of a topmost portion of each preceding device layer, and forming an encapsulation layer along opposite sidewalls of the top electrode, opposite sidewalls of the bottom electrode, and opposite sidewalls of each of the plurality of device layers.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
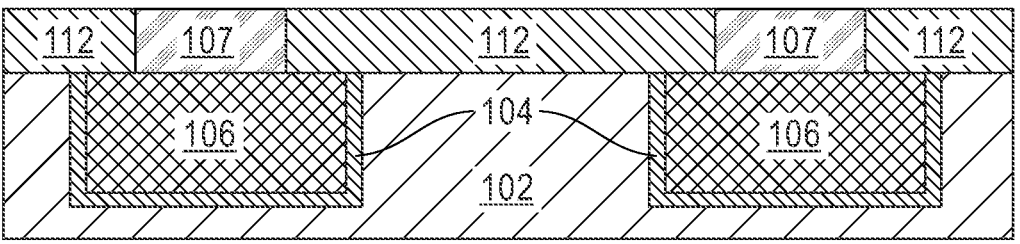
FIG. 1 is a cross-sectional view of a memory device at an intermediate step during a semiconductor manufacturing process, according to an embodiment of the present disclosure.
Figure 2:
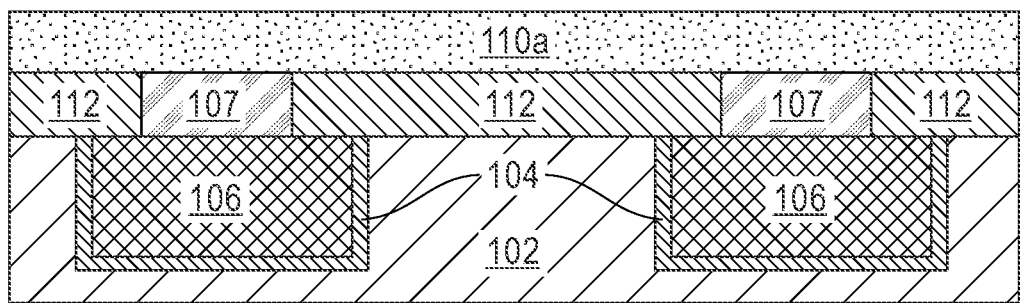
FIG. 2 is a cross-sectional view of the memory device after forming a first conductive material, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

MRAM devices include cells or magnetic storage elements for storing data having a magnetically hard layer (i.e., the reference layer) and a magnetically soft layer (i.e., the free layer) separated by a thin dielectric layer (i.e., the tunnel barrier). This configuration is known as a magnetic tunnel junction (MTJ) pillar. MTJ pillar structures typically include a cobalt (Co)-based synthetic anti-ferromagnet (SAF), a CoFeB-based reference layer, a MgO-based tunnel barrier, a CoFeB-based free layer, and cap layers containing materials such as tantalum (Ta) and/or ruthenium (Ru).

Embedded MTJ structures are usually formed on a bottom electrode (BE) by subtractive patterning of blanket MTJ stacks into pillars between two metal levels. After MTJ stack patterning, the inter-pillar spaces are filled with an interlevel dielectric (ILD) to enable connection to back-end-of-line (BEOL) wiring by a top contact level. As mentioned above, ILD gap fill between MTJ pillars presents a significant challenge since the presence of voids in the ILD between the pillars can lead to electric shorts.

Therefore, embodiments of the present disclosure provide a memory device, and a method of making the same, having beveled device layers for improved ILD gap-fill. More particularly, in the proposed embodiments, the bottom electrode, top electrode, reference and free device layers have the same bevel angle (between 120° and 150° degrees) for providing low aspect ratio pillar structures that can prevent the formation of voids during interlevel dielectric deposition between pillars, thereby reducing the likelihood of top contact shorts. In the proposed embodiments, $Al_2O_3$ encapsulation layers are included for the reference layer, and SiN encapsulation layers for the free layer. In some embodiments, a metal-oxide encapsulation layer (such as $RuO_2$, $IrO_2$) is proposed for the top and bottom electrodes.

Embodiments by which a memory device with beveled device layers can be formed are described in detailed below by referring to the accompanying drawings in FIGS. 1-34.

Referring now to FIG. 1, a cross-sectional view of a memory device 100 is shown at an intermediate step during a semiconductor manufacturing process, according to an embodiment of the present disclosure. The memory device 100 may include any MTJ-containing device such as, for example, MRAM, spin-transfer torque (STT) MRAM, spin-orbit torque (SOT) MRAM and the like. In the embodiment of FIG. 1, the memory device 100 is an MRAM device based on a perpendicular MTJ pillar structure.

The memory device 100 includes a plurality of first conductive structures (hereinafter "first conductive structures") 106 embedded within an interlevel dielectric material or first dielectric layer 102. A first diffusion barrier liner 104 can be formed on sidewalls and a bottom surface of each of the first conductive structures 106, as shown in the figure. Collectively, the first conductive structures 106, the first diffusion barrier liner 104, and the first dielectric layer 102 provide an interconnect level. It should be noted that at least one other interconnect level and/or a middle-of-the-line (MOL) level may be located beneath the interconnect level formed by the first dielectric layer 102, the first conductive structures 106, and the first diffusion barrier liner 104. These other levels are not shown for clarity.

According to an embodiment, the first dielectric layer 102 can be formed, for example, by spin-on deposition, chemical vapor deposition (CVD), or plasma-enhanced CVD (PECVD) of any suitable dielectric material including, but not limited to, SiOC-based dielectrics such as SiCOH, SiCNO, and SiCHNO. The first conductive structures 106 are composed of an electrically conductive metal or metal alloy. Examples of electrically conductive materials that may be used in the present application include copper (Cu), aluminum (Al), or tungsten (W), while an example of an electrically conductive metal alloy is a Cu—Al alloy.

As depicted in the figure, the first diffusion barrier liner 104 is formed along a bottom surface and sidewalls of each of the first conductive structures 106. In some embodiments, no diffusion barrier liner is present. The first diffusion barrier liner 104 is composed of a diffusion barrier material (i.e., a material that serves as a barrier to prevent a conductive material such as copper from diffusing there through). Examples of diffusion barrier materials that can be used in providing the first diffusion barrier liner 104 may include, but are not limited to, Ta, TaN, Ti, TiN, Ru, RuN, RuTa, RuTaN, W, or WN. In some embodiments, the first diffusion barrier liner 104 may include a stack of diffusion barrier materials. In one example, the diffusion barrier material may be composed of a stack of Ta/TaN.

The interconnect level including the first dielectric layer 102, the first conductive structures 106, and the first diffusion barrier liner 104 may be formed utilizing conventional processes that are well-known to those skilled in the art including, for example, a damascene process. So as not to obscure the method of the present application, the techniques used to form the interconnect level including the first dielectric layer 102, the first conductive structures 106, and the first diffusion barrier liner 104 are not provided herein.

The memory device 100 may further include a metal cap 107 formed within a dielectric cap layer 112, as depicted in the figure. In one or more embodiments, the dielectric cap layer 112 may be formed by CVD or PECVD. In an exemplary embodiment, the dielectric cap layer 112 may be composed of a SiN-based dielectric material such as SiN or SiCN.

The metal cap 107 may be provided in cases where the first conductive structure 106 includes a reactive metal such as copper (Cu). In such cases, the metal cap 107 may include a less reactive capping material such as, for example, TaN, WN, and the like. The process of forming the metal cap 107 is standard and well-known in the art. Generally, the process includes depositing the dielectric cap layer 112 above the first conductive structure 106 and the first dielectric layer 102, forming a via or trench feature (not shown) in the dielectric cap layer 112 using standard patterning (lithography) and etching techniques until exposing the first conductive structure 106, and then filling the via or trench feature with the metal capping material using well-known conformal deposition processes, such as atomic layer deposition (ALD), or CVD. A thickness of the metal cap 107 may vary from approximately 5 nm to approximately 200 nm, and ranges therebetween. A planarization process, such as a chemical mechanical polishing (CMP), may be conducted on the memory device 100 to smooth top surfaces of the memory device 100.

Referring now to FIGS. 2-5 simultaneously, cross-sectional views of the memory device 100 are shown depicting operational steps for forming a bottom electrode 110b, according to an embodiment of the present disclosure.

In this embodiment, forming the bottom electrode 110b includes depositing a layer of a first conductive material 110a above the metal cap 107 and dielectric cap layer 112 using well-known conformal deposition processes, such as atomic layer deposition (ALD), or chemical vapor deposition (CVD). Non-limiting example of conductive materials for forming the layer of first conductive material 110a include Ta, TaN, Ti, TiN, Ru, RuN, RuTa, RuTaN, W, WN or any combination thereof. A thickness of the layer of the first conductive material 110a for forming the bottom electrodes 110b may vary from approximately 2 nm to approximately 25 nm, and ranges therebetween, although a thickness less than 2 nm and greater than 25 nm may be acceptable.

Figure 3:
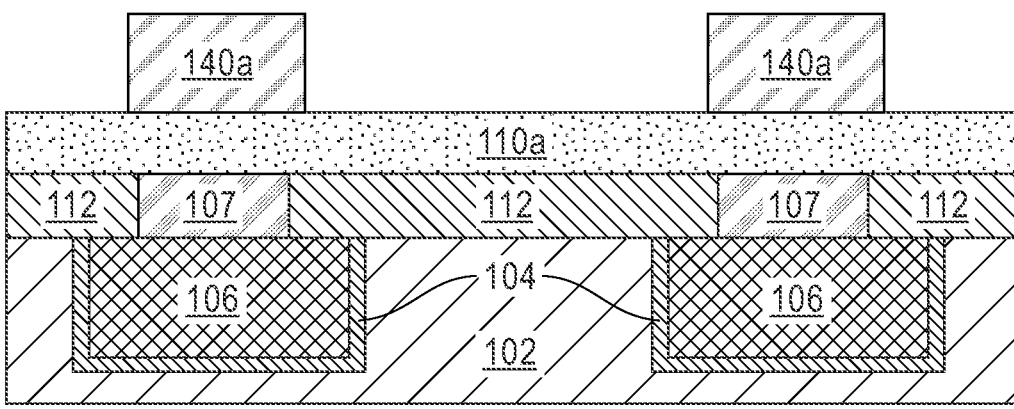
FIG. 3 is a cross-sectional view of the memory device after forming a first hardmask layer and hardmask patterning, according to an embodiment of the present disclosure.

A first hardmask layer 140a is deposited above the layer of first conductive material 110a and patterned using standard deposition and patterning processes. As known by those skilled in the art, patterning of the first hardmask layer 140a involves exposing a pattern on a photoresist layer (not shown) and transferring the exposed pattern to the first hardmask layer 140a using known lithography and reactive ion etching (RIE) processing, as shown in FIG. 3. The first hardmask layer 140a can be formed by depositing a layer of a dielectric material using any suitable deposition process including, for example, CVD. In an exemplary embodiment, the dielectric material forming the first hardmask layer 140a may include silicon nitride (SiN). In one or more embodiments, a (vertical) thickness of the first hardmask layer 140a may vary between approximately 10 nm to approximately 100 nm, although other thicknesses above or below this range may be used as desired for a particular application.

Figure 4:
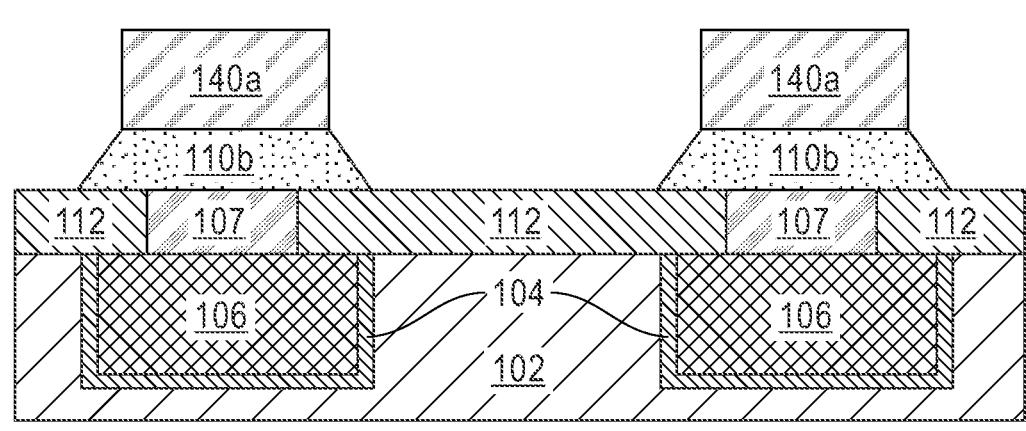
FIG. 4 is a cross-sectional view of the memory device after etching the first conductive material to form a bottom electrode, according to an embodiment of the present disclosure.

After patterning the first hardmask layer 140a, any suitable etching process can be conducted on the memory device 100 to form the bottom electrode(s) 110b, as depicted in FIG. 4. According to an exemplary embodiment, an ion-beam etch (IBE) process is conducted on the memory device 100 to form the bottom electrodes 110b having a first bevel or slope angle. Stated differently, the bottom electrodes 110b may be formed having a first reversed or positive taper profile. As may be understood, a (positive or negative) taper profile can be defined by the difference between a bottom critical dimension (CD) and a top CD, i.e., taper profile=bottom CD-top CD. Thus, in this embodiment, the bottommost portion or bottom CD of each of the bottom electrodes 110b is larger than a topmost portion or top CD of each of the bottom electrodes 110b, thus providing a positive taper profile.

Figure 5:
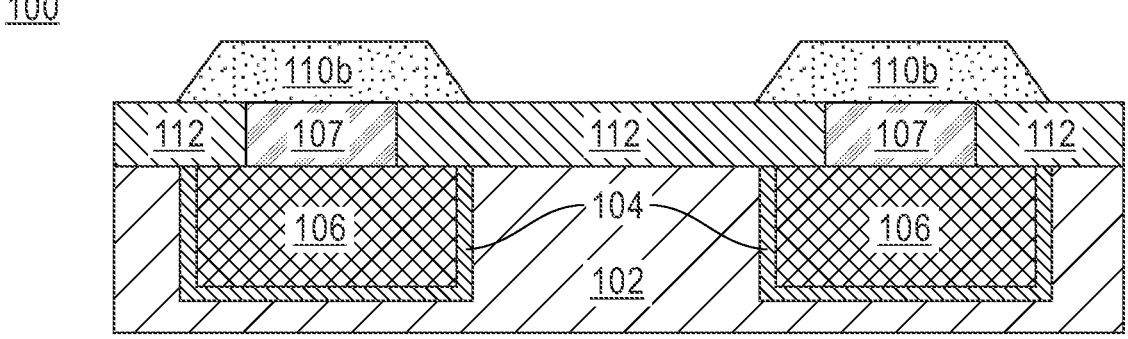
FIG. 5 is a cross-sectional view of the memory device after removing the first hardmask layer, according to an embodiment of the present disclosure.

After forming the (bevel) bottom electrodes 110, an etching process (e.g., RIE) can be conducted on the memory device 100 to remove the first hardmask layer 140a, as shown in FIG. 5.

Referring now to FIGS. 6-9 simultaneously, cross-sectional views of the memory device 100 are shown depicting operational steps for forming a first encapsulation layer 150a, according to an embodiment of the present disclosure.

Figure 6:
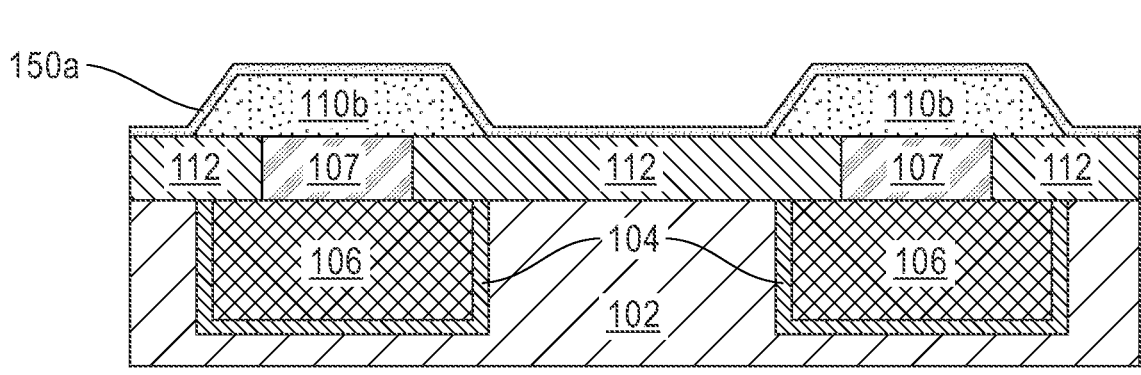
FIG. 6 is a cross-sectional view of the memory device after forming a first encapsulation layer, according to an embodiment of the present disclosure.

According to an embodiment, the first encapsulation layer 150a is conformally deposited on the memory device 100 substantially covering top surfaces of the bottom electrodes 110b and dielectric cap layer 112, as shown in FIG. 6. Non-limiting examples of deposition processes for forming the first encapsulation layer 150a may include CVD or ALD. In one or more embodiments, the first encapsulation layer 150a may be made of a nitride material including, for example, silicon nitride (SiN). However, in other embodiments, the first encapsulation layer 150a may be made of a metal-oxide material including, for example, ruthenium oxide ($RuO_2$) or iridium oxide ($IrO_2$).

A thickness of the first encapsulation layer 150a may vary from approximately 2 nm to approximately 20 nm, and ranges therebetween, although a thickness less than 2 nm and greater than 20 nm may be acceptable.

Figure 7:
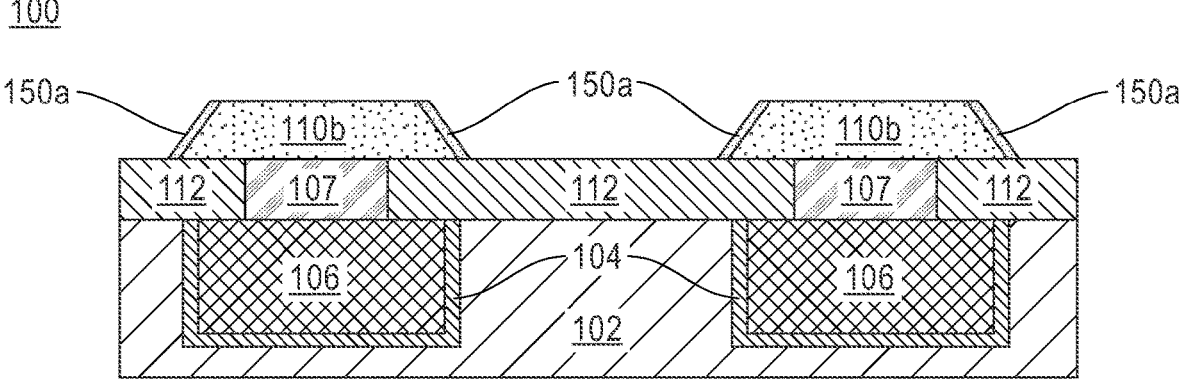
FIG. 7 is a cross-sectional view of the memory device after etching the first encapsulation layer, according to an embodiment of the present disclosure.

An etching process, such as RIE or IBE, can be conducted on the memory device 100 following the deposition of the first encapsulation layer 150a to remove horizontal portions of the first encapsulation layer 150a, i.e., to remove portions of the first encapsulation layer 150a parallel to the metal cap 107 and dielectric cap layer 112, as depicted in FIG. 7.

Figure 8:
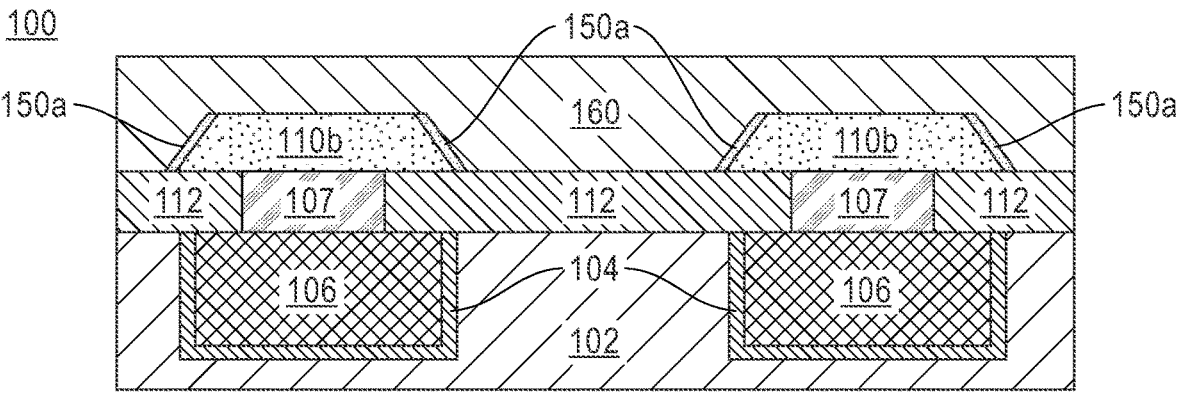
FIG. 8 is a cross-sectional view of the memory device after forming an interlevel dielectric layer, according to an embodiment of the present disclosure.
Figure 9:
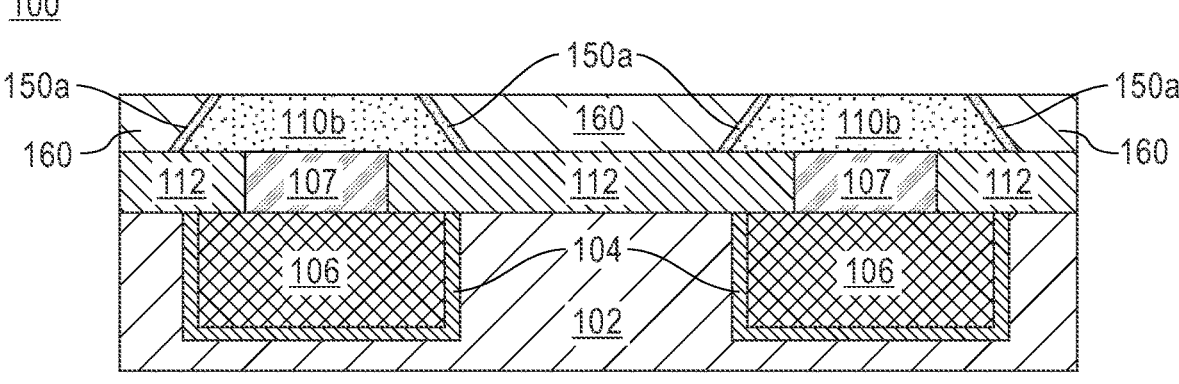
FIG. 9 is a cross-sectional view of the memory device after planarizing the interlevel dielectric layer, according to an embodiment of the present disclosure.

The process continues by depositing an interlevel dielectric layer or second dielectric layer 160 above the bottom electrodes 110b and dielectric cap layer 112 to fill a space between bottom electrodes 110b, as shown in FIG. 8. The second dielectric layer 160 is made of analogous materials and formed in similar ways as the first dielectric layer 102. In one or more embodiments, a (vertical) thickness of the second dielectric layer 160 may vary between approximately 2 nm to approximately 30 nm, although other thicknesses above or below this range may be used as desired for a particular application. A planarization process (e.g., CMP) can be conducted on the memory device 100 such that uppermost surfaces of the bottom electrodes 110b, first encapsulation layer 150a, and second dielectric layer 160 are substantially flush or coplanar, as depicted in FIG. 9.

Referring now to FIGS. 10-25 simultaneously, cross-sectional views of the memory device 100 are shown depicting operational steps for forming a beveled magnetic tunnel junction (MTJ) pillar, according to an embodiment of the present disclosure.

Figure 25:
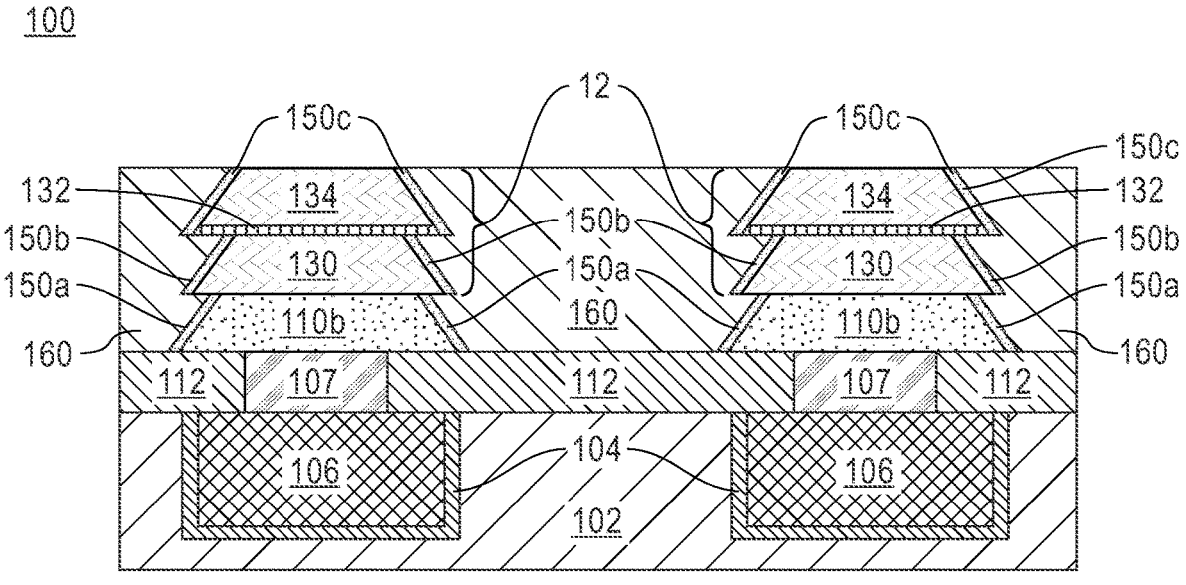
FIG. 25 is a cross-sectional view of the memory device after planarizing the interlevel dielectric layer, according to an embodiment of the present disclosure.
Figure 26:
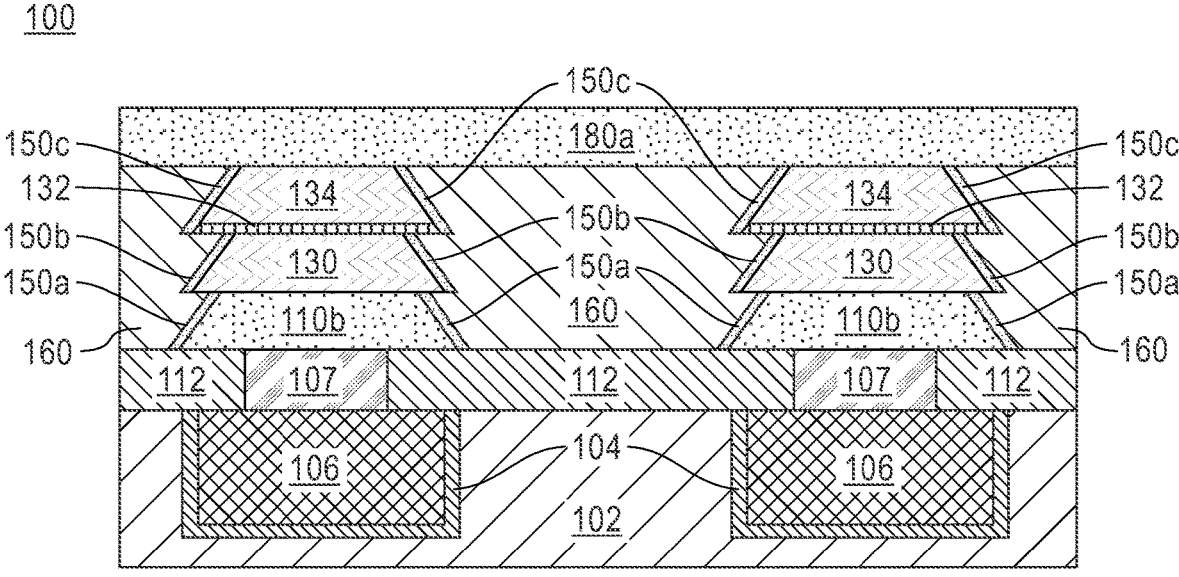
FIG. 26 is a cross-sectional view of the memory device after forming a second conductive material, according to an embodiment of the present disclosure.
Figure 27:
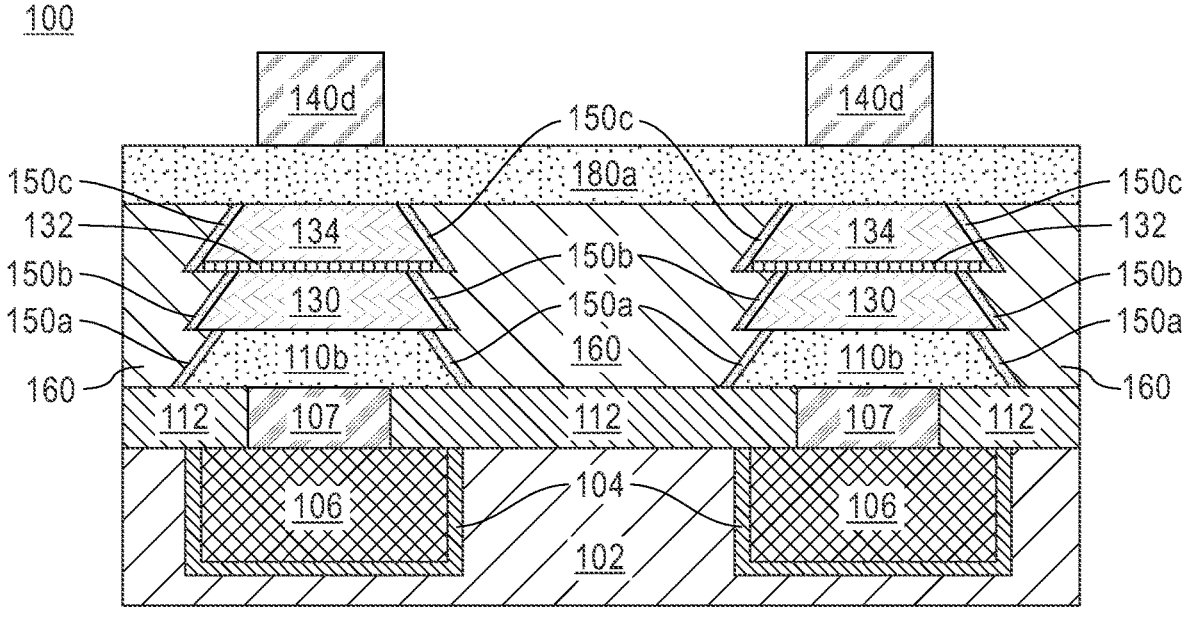
FIG. 27 is a cross-sectional view of the memory device after forming a fourth hardmask layer and hardmask patterning, according to an embodiment of the present disclosure.

The following described embodiments provide operational steps for forming the MTJ pillar 12 with beveled or sloping sidewalls as configured in FIG. 25. Typically, the MTJ pillar 12 (FIG. 25) may be composed of a plurality of device layers including at least one of a magnetic reference layer 130, a tunnel barrier layer 132, and a magnetic free layer 134. It should be noted that other configurations are possible for the MTJ stack forming the MTJ pillar 12 including, for example, the magnetic free layer 134 being located at the bottom of the MTJ pillar 12 and the magnetic reference layer 130 being at the top of the MTJ pillar 12.

It should be noted that some elements and/or features of the memory device 100 are illustrated in the figures but not described in detail in order to avoid unnecessarily obscuring the presented embodiments. For illustration purposes only, without intent of limitation, only two MTJ pillars 12 are depicted in the figure. As may be understood by those skilled in the art, more than two MTJ pillars 12 can be formed in the memory device 100.

Figure 10:
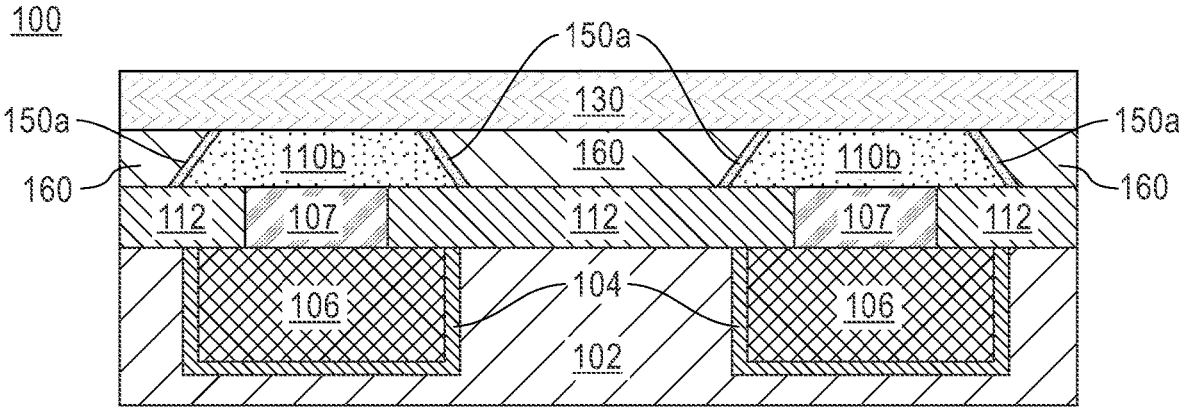
FIG. 10 is a cross-sectional view of the memory device after depositing a magnetic reference layer, according to an embodiment of the present disclosure.
Figure 11:
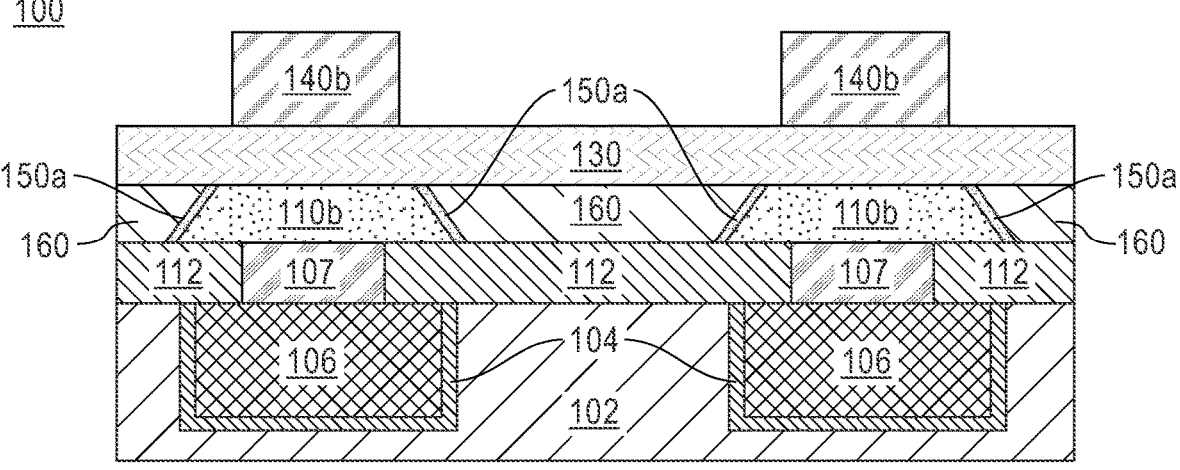
FIG. 11 is a cross-sectional view of the memory device after forming a second hardmask layer and hardmask patterning, according to an embodiment of the present disclosure.

With reference to FIG. 10, the magnetic reference layer 130 is formed on the memory device 100 above top surfaces of the bottom electrodes 110b, first encapsulation layer 150a and second dielectric layer 160. In general, the various material layers of the MTJ pillars 12 depicted in FIG. 25 can be formed by utilizing one or more deposition processes such as, for example, plating, sputtering, plasma-enhanced atomic layer deposition (PEALD), plasma-enhanced chemical vapor deposition (PECVD) or physical vapor deposition (PVD).

As may be understood, the magnetic reference layer 130 has a fixed magnetization. The magnetic reference layer 130 may be composed of a metal or metal alloy (or a stack thereof) that includes one or more metals exhibiting high spin polarization. In alternative embodiments, exemplary metals for the formation of the magnetic reference layer 130 may include iron, nickel, cobalt, chromium, boron, or manganese. Exemplary metal alloys may include the metals exemplified by the above. In another embodiment, the magnetic reference layer 130 may be a multilayer arrangement having (1) a high spin polarization region formed from a metal and/or metal alloy using the metals mentioned above, and (2) a region constructed of a material or materials that exhibit strong perpendicular magnetic anisotropy (strong PMA). Exemplary materials with strong PMA that may be used include materials containing metals such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

Figure 12:
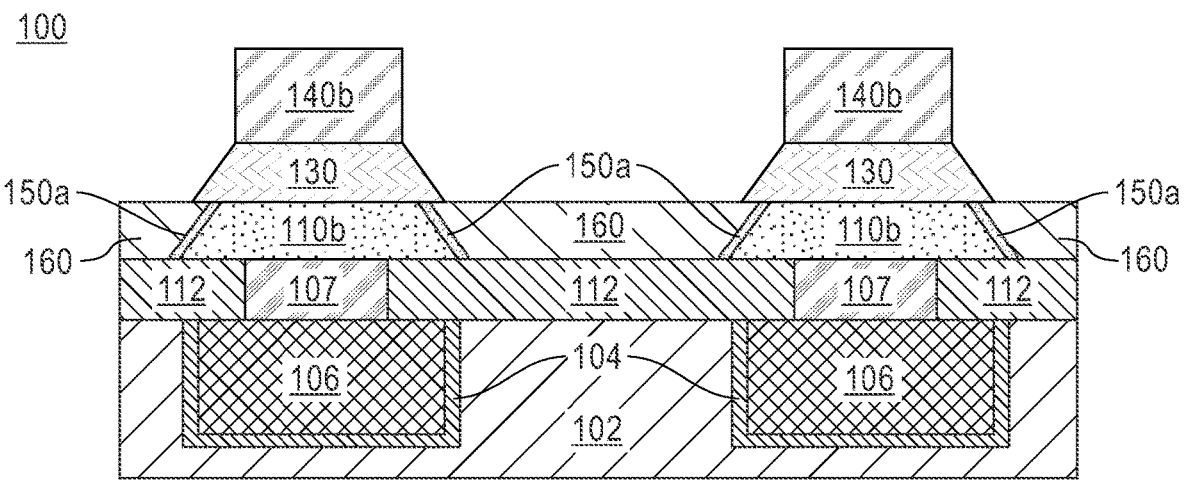
FIG. 12 is a cross-sectional view of the memory device after etching the magnetic reference layer, according to an embodiment of the present disclosure.

A second hardmask layer 140b can be deposited above the magnetic reference layer 130 and patterned using standard deposition and patterning processes. Similar to the first hardmask layer 140a, patterning of second hardmask layer 140b involves exposing a pattern on a photoresist layer (not shown) and transferring the exposed pattern to the magnetic reference layer 130 using known lithography and RIE processing, as shown in FIG. 12. The second hardmask layer 140b may be made of analogous materials and formed in similar ways as the first hardmask layer 140a. In one or more embodiments, a (vertical) thickness of the second hardmask layer 140b may vary between approximately 10 nm to approximately 100 nm, although other thicknesses above or below this range may be used as desired for a particular application.

According to an exemplary embodiment, an IBE process is conducted on the memory device 100 to form the magnetic reference layer 130 having a second bevel or slope angle. Similar to the bottom electrode(s) 110(b), a bottommost portion or bottom CD of the magnetic reference layer 130 is larger than a topmost portion or top CD of the magnetic reference layer 130. Thus, in the depicted embodiment, the magnetic reference layer 130 includes a second positive taper profile. It should be noted that the bottommost portion of the magnetic reference layer 130 is larger than a topmost portion of the bottom electrode(s) 110b for substantially covering the topmost portion of the bottom electrode(s) 110b.

Figure 13:
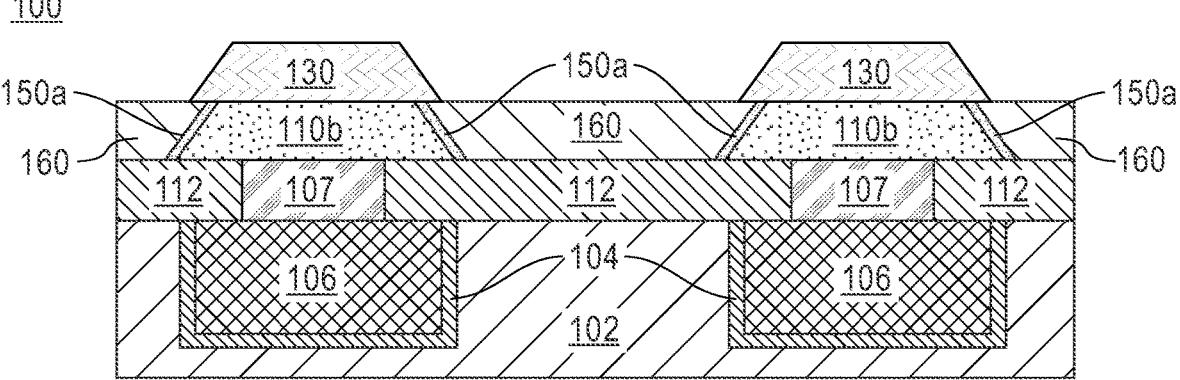
FIG. 13 is a cross-sectional view of the memory device after removing the second hardmask layer, according to an embodiment of the present disclosure.

An etching process (e.g., RIE) can be subsequently conducted on the memory device 100 to remove the second hardmask layer 140b, as depicted in FIG. 13.

Figure 14:
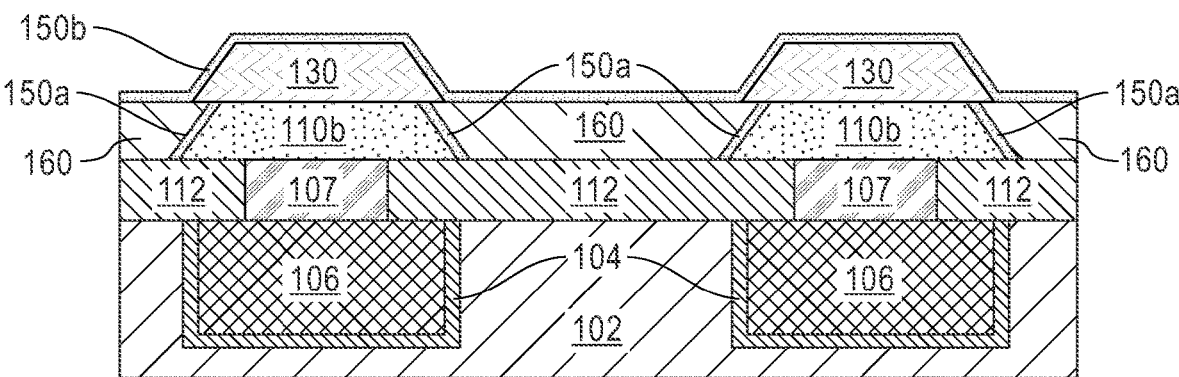
FIG. 14 is a cross-sectional view of the memory device after forming a second encapsulation layer, according to an embodiment of the present disclosure.

With reference now to FIG. 14, the process continues by conformally depositing a second encapsulation layer 150b above and in direct contact with the magnetic reference layer 130 and second dielectric layer 160. Non-limiting examples of deposition processes for forming the second encapsulation layer 150b may include CVD or ALD. In one or more embodiments, the second encapsulation layer 150b may be made of a nitride material including, for example, silicon nitride (SiN). However, in other embodiments, the second encapsulation layer 150b may be made of an oxynitride material including, for example, aluminum oxynitride (AlON). A thickness of the second encapsulation layer 150b may vary from approximately 2 nm to approximately 20 nm, and ranges therebetween, although a thickness less than 2 nm and greater than 20 nm may be acceptable.

Figure 15:
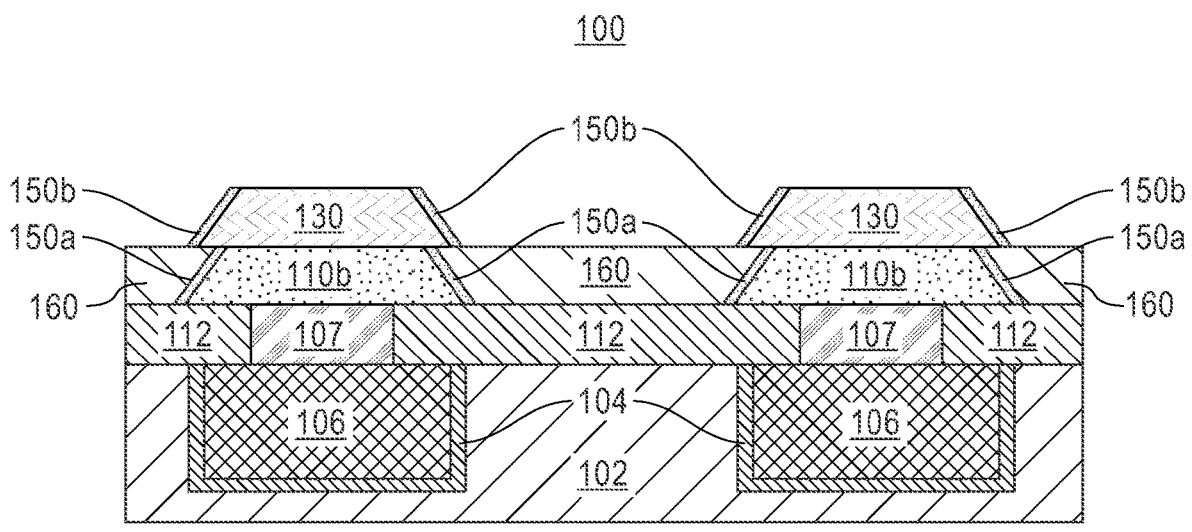
FIG. 15 is a cross-sectional view of the memory device after etching the second encapsulation layer, according to an embodiment of the present disclosure.

An etching process (e.g., RIE or IBE) can be conducted on the memory device 100 following the deposition of the second encapsulation layer 150b to remove horizontal portions of the second encapsulation layer 150b, i.e., portions of the second encapsulation layer 150b parallel to the magnetic reference layer 130, as depicted in FIG. 15. Accordingly, the second encapsulation layer 150b remains on (opposite) lateral sidewalls of the magnetic reference layer 130 of the MTJ pillars 12. The first and second encapsulation layers 150a, 150b disposed on sidewalls of the bottom electrode 110b and magnetic reference layer 130 may protect these regions of the MTJ pillars 12 during subsequent processing steps.

Figure 16:
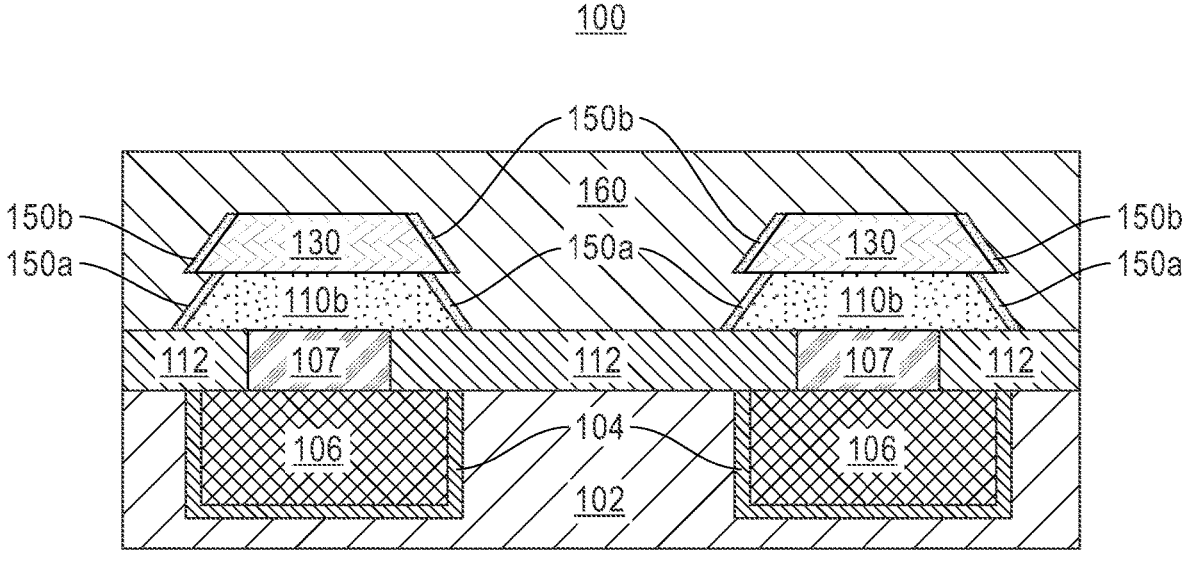
FIG. 16 is a cross-sectional view of the memory device after forming an interlevel dielectric layer, according to an embodiment of the present disclosure.
Figure 17:
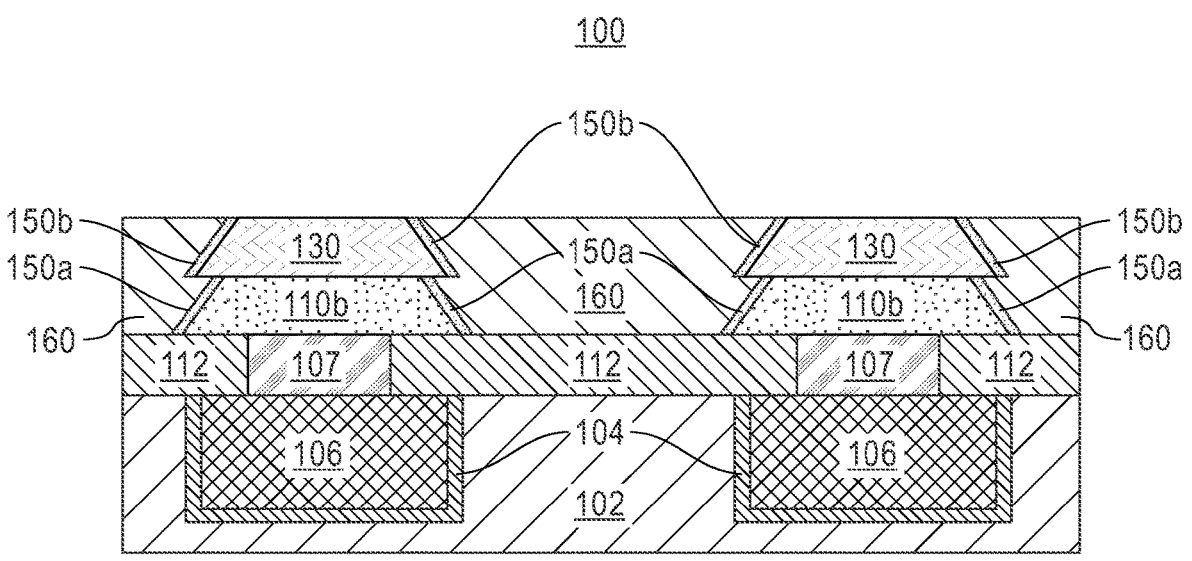
FIG. 17 is a cross-sectional view of the memory device after planarizing the interlevel dielectric layer, according to an embodiment of the present disclosure.
Figure 18:
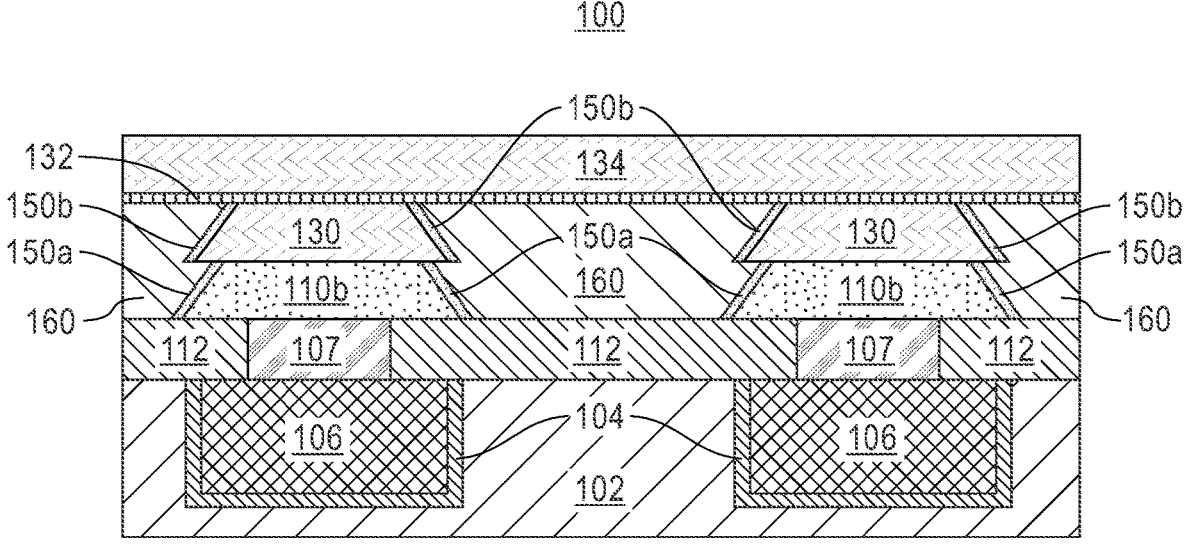
FIG. 18 is a cross-sectional view of the memory device after depositing a tunnel barrier layer followed by a magnetic free layer, according to an embodiment of the present disclosure.

The process continues by depositing an interlevel dielectric filling layer to fill spaces between magnetic reference layer(s) 130, as depicted in FIG. 16. In one or more embodiments, the deposited interlevel dielectric filling material is the same material used to form the second dielectric layer 160. Thus, for ease of illustration, the deposited interlevel dielectric filling layer will be continued to be referred as second dielectric layer 160. A planarization process (e.g., CMP) can be conducted on the memory device 100 such that uppermost surfaces of the magnetic reference layer(s) 130, second encapsulation layer 150b, and second dielectric layer 160 are substantially flush or coplanar, as depicted in FIG. 17.

To continue forming the MTJ pillar 12 (FIG. 25), after the planarization process, the tunnel barrier layer 132 is deposited above the uppermost surfaces of the magnetic reference layer 130, second encapsulation layer 150b, and second dielectric layer 160. Following the deposition of the tunnel barrier layer 132, the magnetic free layer 134 is deposited above the tunnel barrier layer 132. In one or more embodiments, the tunnel barrier layer 132 is composed of an insulator material and is formed at such a thickness as to provide an appropriate tunneling resistance. Exemplary materials for the tunnel barrier layer 132 may include magnesium oxide, aluminum oxide, and titanium oxide, or materials of higher electrical tunnel conductance, such as semiconductors or low-bandgap insulators. The magnetic free layer 134 may be composed of a magnetic material (or a stack of magnetic materials) with a magnetization that can be changed in orientation relative to the magnetization orientation of the magnetic reference layer 130. Exemplary magnetic materials for the magnetic free layer 134 include alloys and/or multilayers of cobalt, iron, alloys of cobalt-iron, nickel, alloys of nickel-iron, and alloys of cobalt-iron-boron.

In some embodiments, the MTJ pillars 12 (FIG. 25) may also include a non-magnetic spacer layer (not shown) located on the magnetic free layer, a second magnetic free layer located on the non-magnetic spacer layer, and/or a MTJ cap layer located on the magnetic free layer 134 or on the second magnetic free layer.

Figure 19:
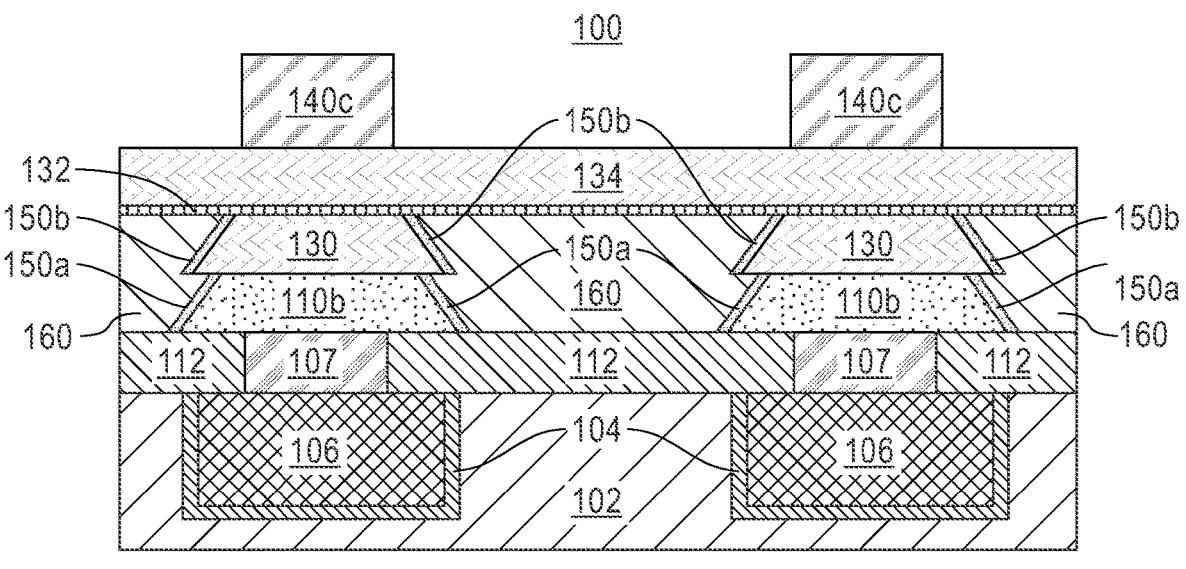
FIG. 19 is a cross-sectional view of the memory device after forming a third hardmask layer and hardmask patterning, according to an embodiment of the present disclosure.

As depicted in FIG. 19, a third hardmask layer 140c can be deposited above the magnetic free layer 134 and patterned using standard deposition and patterning processes. Similar to the first and second hardmask layers 140a, 140b, patterning of the third hardmask layer 140c involves exposing a pattern on a photoresist layer (not shown) and transferring the exposed pattern to the third hardmask layer 140c using known lithography and RIE processing. The third hardmask layer 140c may be made of analogous materials and formed in similar ways as the first and second hardmask layers 140a, 140b. In one or more embodiments, a (vertical) thickness of the third hardmask layer 140c may vary between approximately 10 nm to approximately 100 nm, although other thicknesses above or below this range may be used as desired for a particular application.

Figure 20:
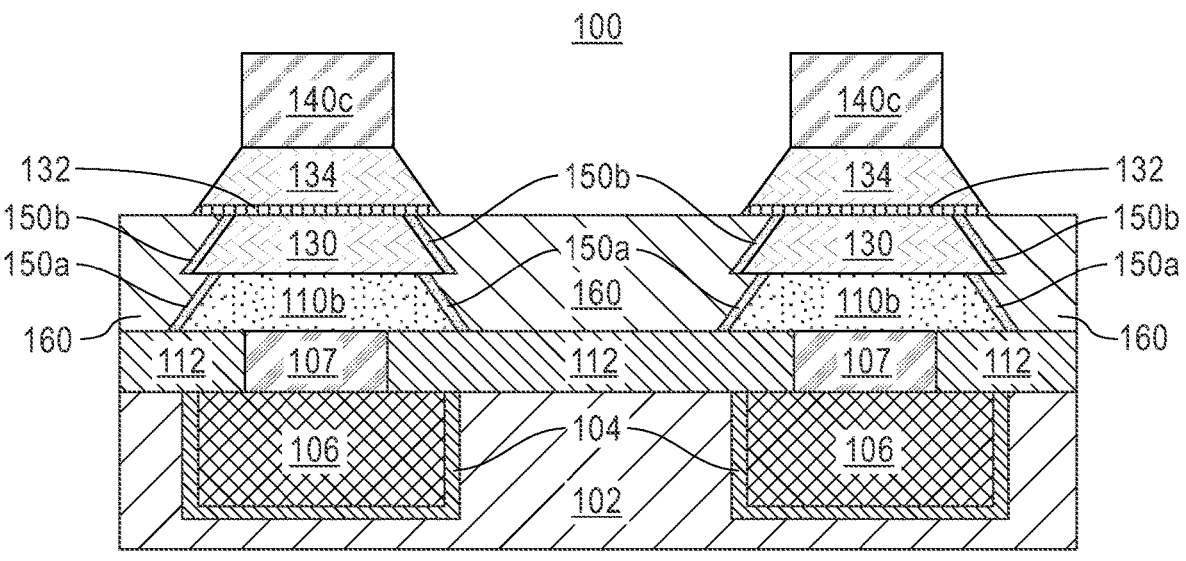
FIG. 20 is a cross-sectional view of the memory device after etching the tunnel barrier layer and the magnetic free layer, according to an embodiment of the present disclosure.
Figure 21:
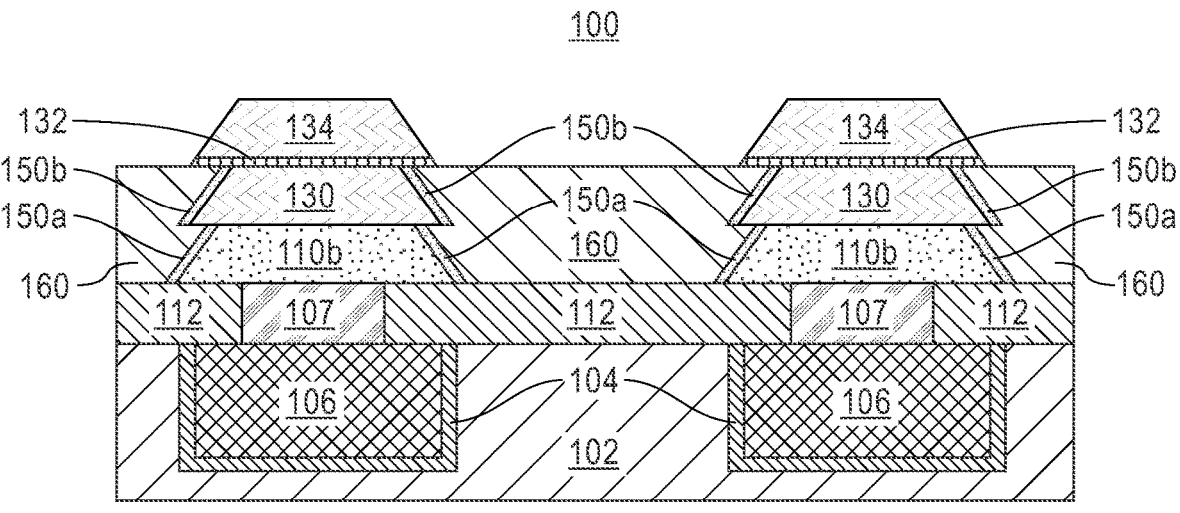
FIG. 21 is a cross-sectional view of the memory device after removing the third hardmask layer, according to an embodiment of the present disclosure.

After patterning the third hardmask layer 140c, any suitable etching process can be conducted on the memory device 100 to etch the tunnel barrier layer 132 and the magnetic free layer 134, as depicted in FIG. 20. According to an exemplary embodiment, an IBE process is conducted on the memory device 100 to simultaneously etch the tunnel barrier layer 132 and the magnetic free layer 134 having a third bevel or slope angle. Similar to the bottom electrode(s) 110(b) and magnetic reference layer 130, a bottommost portion or bottom CD of the magnetic free layer 134 is larger than a topmost portion or top CD of the magnetic free layer 134. Similarly, a bottommost portion or bottom CD of the tunnel barrier layer 132 is larger than a topmost portion or top CD of the tunnel barrier layer 132. Thus, in the depicted embodiment, the magnetic reference layer 130 and tunnel barrier layer 132 are formed with a third positive taper profile. It should be noted that the bottommost portion of the tunnel barrier layer 132 is larger than a topmost portion of the magnetic reference layer 130 for substantially covering the topmost portion of the magnetic reference layer 130, as depicted in FIG. 20.

After etching the tunnel barrier layer 132 and the magnetic free layer 134, the third hardmask layer 140C can be removed using any suitable etching technique.

Figure 22:
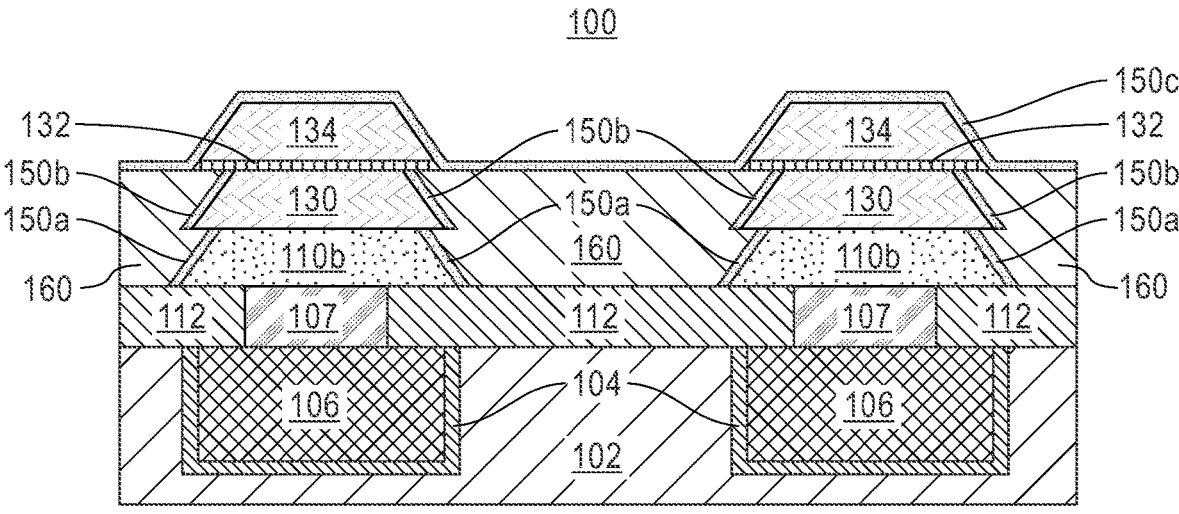
FIG. 22 is a cross-sectional view of the memory device after forming a third encapsulation layer, according to an embodiment of the present disclosure.

With reference now to FIG. 22, the process continues by conformally depositing a third encapsulation layer 150c above and in direct contact with the magnetic free layer 134 and second dielectric layer 160. Non-limiting examples of deposition processes for forming the third encapsulation layer 150c may include CVD or ALD. In an exemplary embodiments, the third encapsulation layer 150c may be made of a nitride material including, for example, silicon nitride (SiN). A thickness of the third encapsulation layer 150c may vary from approximately 2 nm to approximately 20 nm, and ranges therebetween, although a thickness less than 2 nm and greater than 20 nm may be acceptable.

Figure 23:
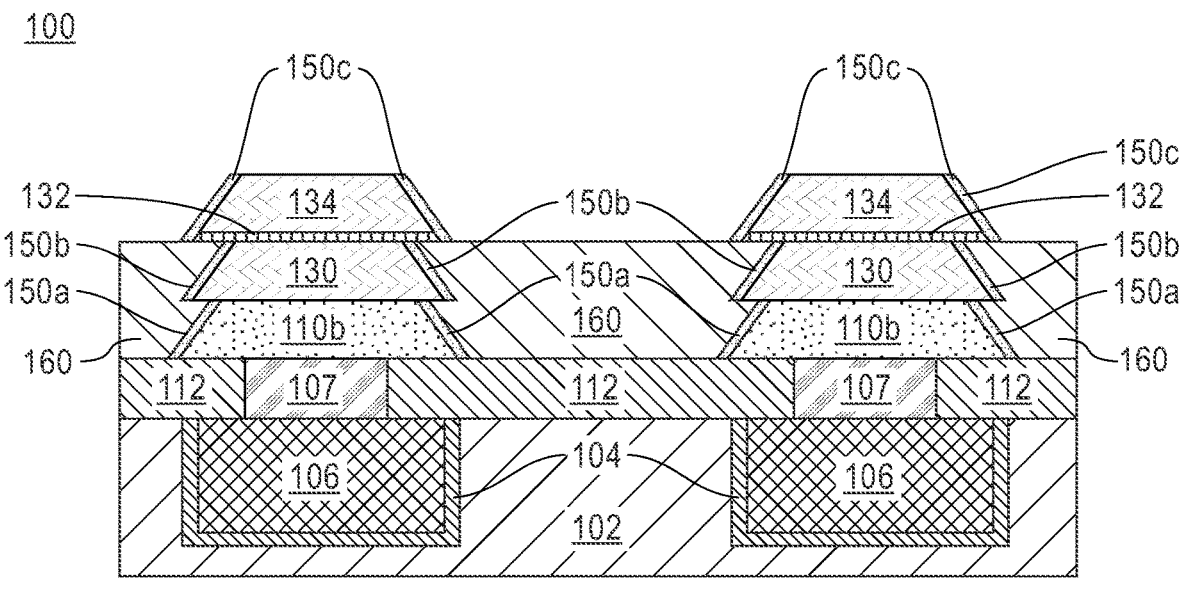
FIG. 23 is a cross-sectional view of the memory device after etching the third encapsulation layer, according to an embodiment of the present disclosure.

An etching process (e.g., RIE or IBE) can be conducted on the memory device 100 following the deposition of the third encapsulation layer 150c to remove horizontal portions of the third encapsulation layer 150c, i.e., portions of the third encapsulation layer 150c parallel to the magnetic free layer 134, as depicted in FIG. 23. Accordingly, the third encapsulation layer 150c remains on (opposite) lateral sidewalls of the tunnel barrier layer 132 and the magnetic free layer 134 of the MTJ pillars 12. The third encapsulation layer 150c may protect the tunnel barrier layer 132 and the magnetic free layer 134 of the MTJ pillars 12 during subsequent processing steps.

Figure 24:
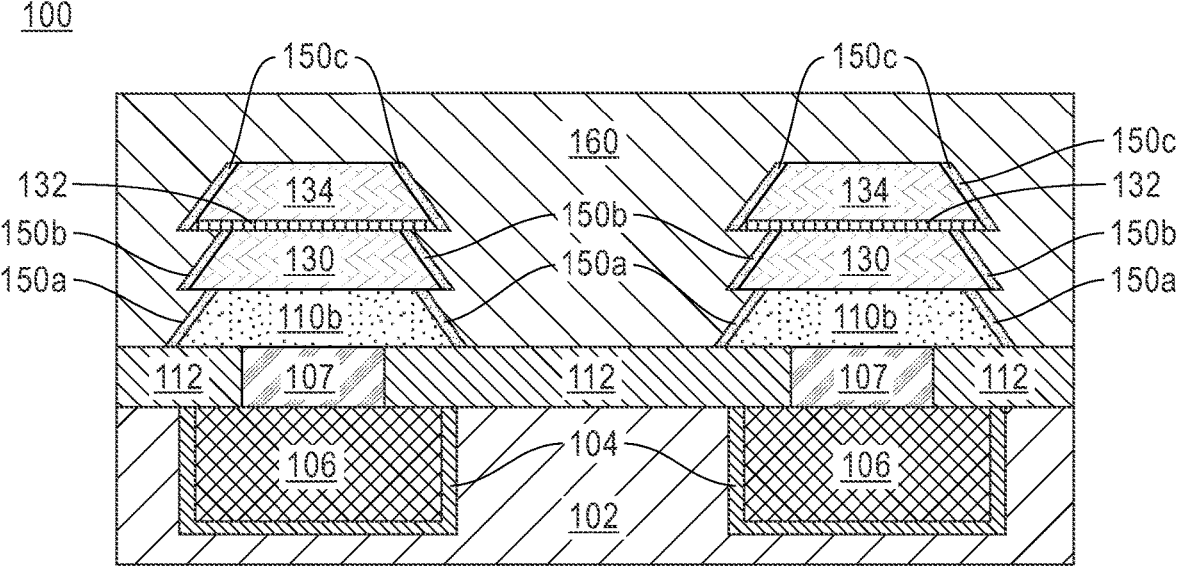
FIG. 24 is a cross-sectional view of the memory device after forming an interlevel dielectric layer, according to an embodiment of the present disclosure.

The process continues by depositing an interlevel dielectric filling layer to fill spaces between tunnel barrier magnetic free layer(s) 132, 134, as depicted in FIG. 24. As mentioned above, for ease of illustration, the deposited interlevel dielectric filling layer will be continued to be referred as second dielectric layer 160 since it is made of the same materials. A planarization process (e.g., CMP) can be conducted on the memory device 100 such that uppermost surfaces of the magnetic free layer(s) 134, third encapsulation layer 150c, and second dielectric layer 160 are substantially flush or coplanar, as depicted in FIG. 25.

It should be noted that the MTJ pillar 12 as depicted in FIG. 25 is composed of a sequence of vertically stacked device layers including beveled or sloping sidewalls. Specifically, each of the magnetic reference layer 130, tunnel barrier layer 132, and magnetic free layer 134 in the MTJ pillar 12 is formed with a bevel angle or positive taper profile such that the MTJ pillar 12 includes symmetrical sloping edges. This configuration provides low aspect ratio MTJ pillars 12 for void-free deposition of interlevel dielectric materials.

Referring now to FIGS. 26-32 simultaneously, cross-sectional views of the memory device 100 are shown depicting operational steps for forming top electrodes 180b, according to an embodiment of the present disclosure.

In this embodiment, forming the top electrodes 180b includes depositing a layer of a second conductive material 180a above the magnetic free layer 134 and second dielectric layer 160 using well-known conformal deposition processes, such as ALD or CVD. Non-limiting examples of conductive materials for forming the layer of second conductive material 180a include Ta, TaN, Ti, TiN, Ru, RuN, RuTa, RuTaN, W, WN or any combination thereof. A thickness of the layer of the second conductive material 180a for forming the top electrodes 180b may vary from approximately 2 nm to approximately 25 nm, and ranges therebetween, although a thickness less than 2 nm and greater than 25 nm may be acceptable.

A fourth hardmask layer 140d can be deposited above the second conductive material 180a and patterned using standard deposition and patterning processes. Similar to the first, second and third hardmask layers 140a, 140b, 140c patterning of the fourth hardmask layer 140d involves exposing a pattern on a photoresist layer (not shown) and transferring the exposed pattern to the fourth hardmask layer 140d using known lithography and RIE processing, as shown in FIG. 22. The fourth hardmask layer 140d may be made of analogous materials and formed in similar ways as the first, second and third hardmask layers 140a, 140b, 140c. In one or more embodiments, a (vertical) thickness of the fourth hardmask layer 140d may vary between approximately 10 nm to approximately 100 nm, although other thicknesses above or below this range may be used as desired for a particular application.

Figure 28:
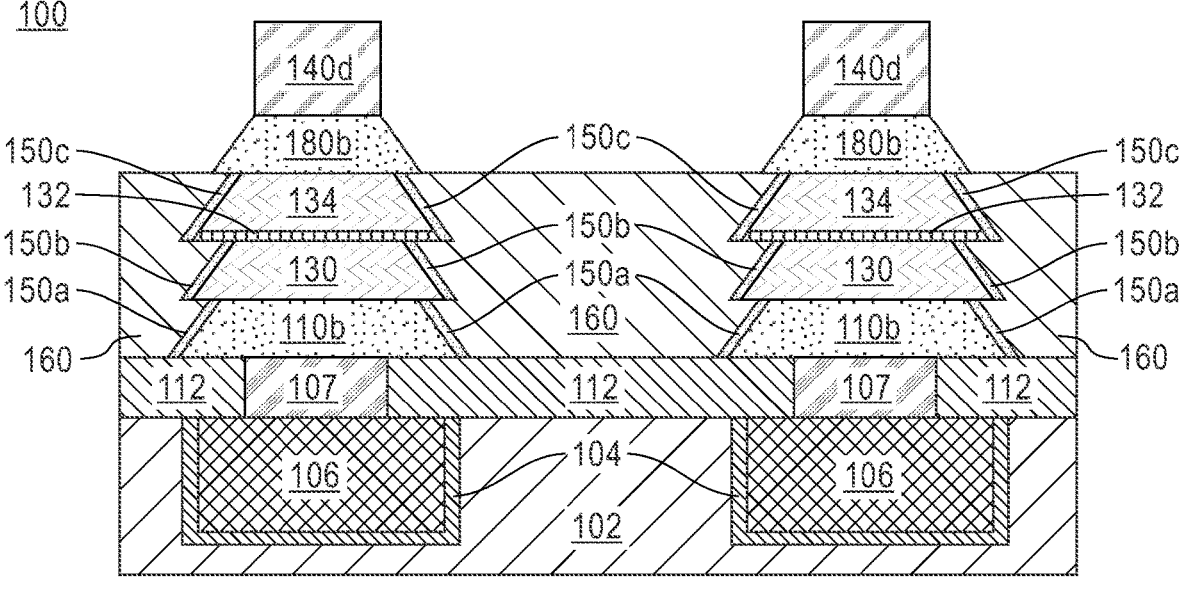
FIG. 28 is a cross-sectional view of the memory device after etching the second conductive material to form a top electrode, according to an embodiment of the present disclosure.

After patterning the fourth hardmask layer 140d, any suitable etching process can be conducted on the memory device 100 to form the top electrode(s) 180b, as depicted in FIG. 28. According to an exemplary embodiment, an IBE process is conducted on the memory device 100 to form the top electrodes 180b having a second bevel or slope angle. Similar to the bottom electrode(s) 110(b) and device layers of the MTJ pillar(s) 12, a bottommost portion or bottom CD of the top electrode(s) 180b is larger than a topmost portion or top CD of the top electrode(s) 180b. Thus, in the depicted embodiment, each of the top electrodes 180b includes a second positive taper profile. It should be noted that the bottommost portion of the top electrodes 180b is larger than a topmost portion of the magnetic free layer 134 for substantially covering the topmost portion of the magnetic free layer 134.

Figure 29:
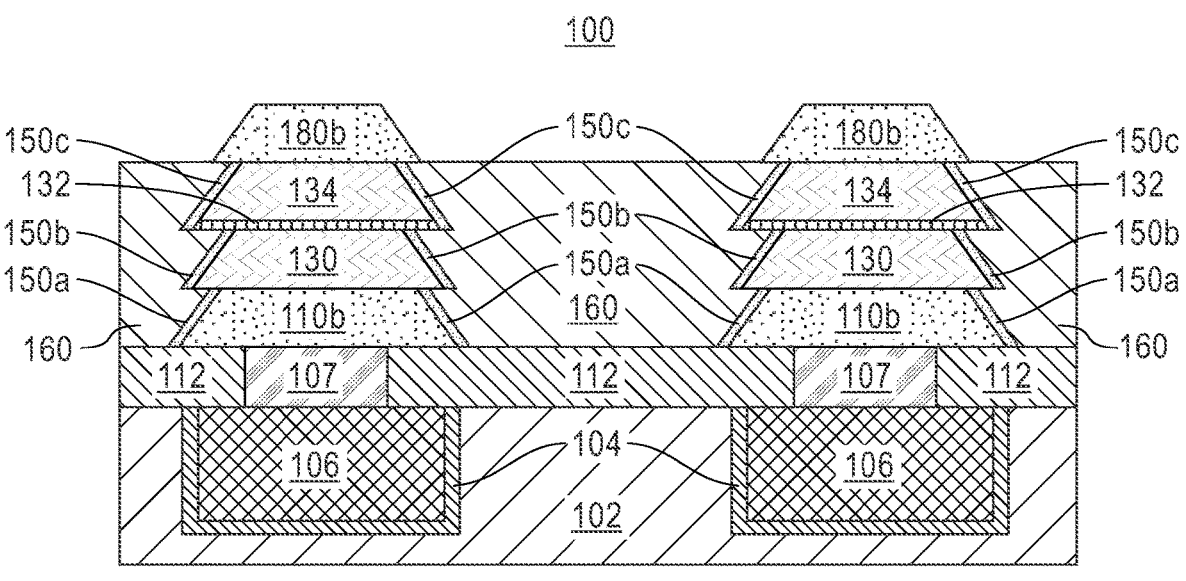
FIG. 29 is a cross-sectional view of the memory device after removing the fourth hardmask layer, according to an embodiment of the present disclosure.

After forming the top electrodes 180b, an etching process (e.g., RIE) can be conducted on the memory device 100 to remove the fourth hardmask layer 140d, as shown in FIG. 29.

Figure 30:
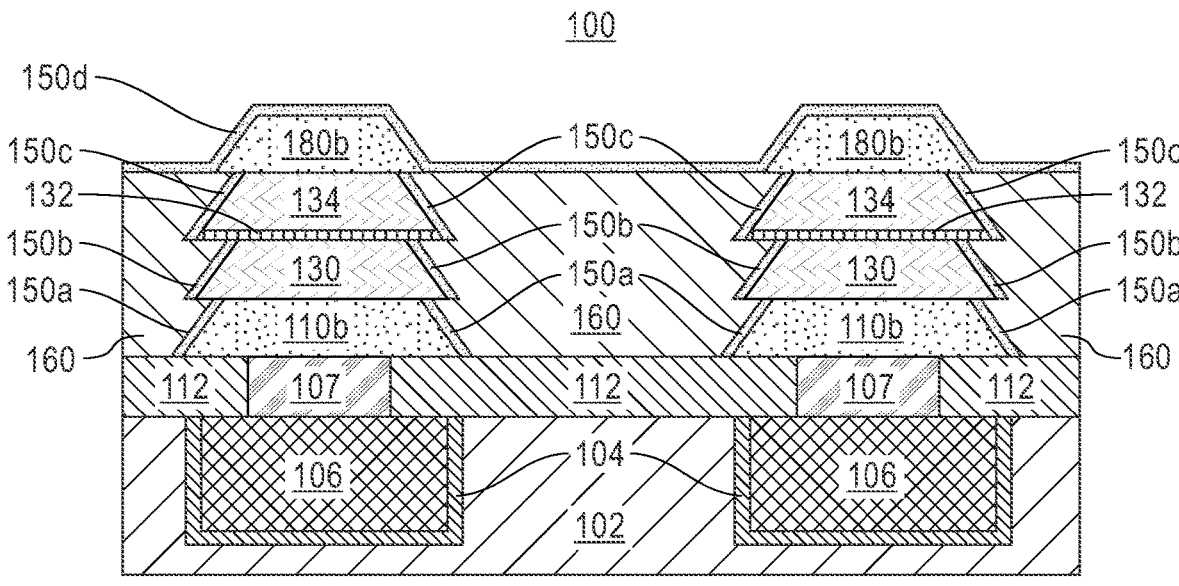
FIG. 30 is a cross-sectional view of the memory device after forming a fourth encapsulation layer, according to an embodiment of the present disclosure.

With reference now to FIG. 30, the process continues by conformally depositing a fourth encapsulation layer 150d above and in direct contact with the top electrodes 180b and second dielectric layer 160. Non-limiting examples of deposition processes for forming the fourth encapsulation layer 150d may include CVD or ALD. In one or more embodiments, the fourth encapsulation layer 150d may be made of a nitride material including, for example, silicon nitride (SiN). However, in other embodiments, the fourth encapsulation layer 150d may be made of a metal-oxide material including, for example, ruthenium oxide ($RuO_2$) or iridium oxide ($IrO_2$). A thickness of the fourth encapsulation layer 150d may vary from approximately 2 nm to approximately 20 nm, and ranges therebetween, although a thickness less than 2 nm and greater than 20 nm may be acceptable.

Figure 31:
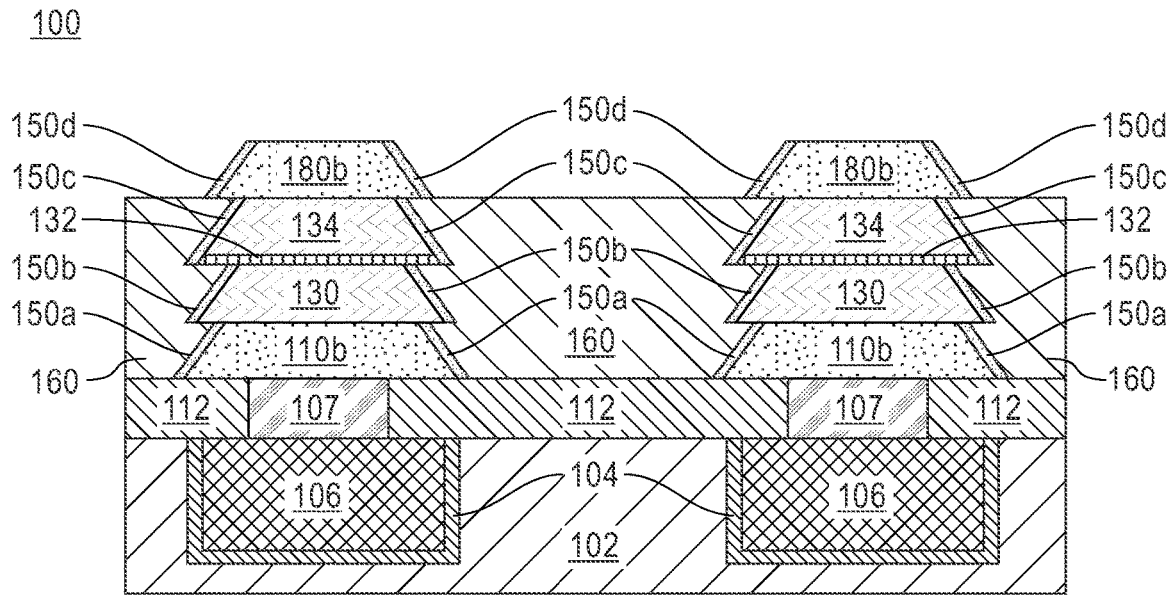
FIG. 31 is a cross-sectional view of the memory device after etching the fourth encapsulation layer, according to an embodiment of the present disclosure.

An etching process (e.g., RIE or IBE) can be conducted on the memory device 100 following the deposition of the fourth encapsulation layer 150d to remove horizontal portions of the fourth encapsulation layer 150d, i.e., portions of the fourth encapsulation layer 150d parallel to the top electrode 180b, as depicted in FIG. 31. Accordingly, the fourth encapsulation layer 150d remains on (opposite) lateral sidewalls of each of the top electrodes 180b. The fourth encapsulation layer 150d may protect the top electrodes 180b during subsequent processing steps.

Figure 32:
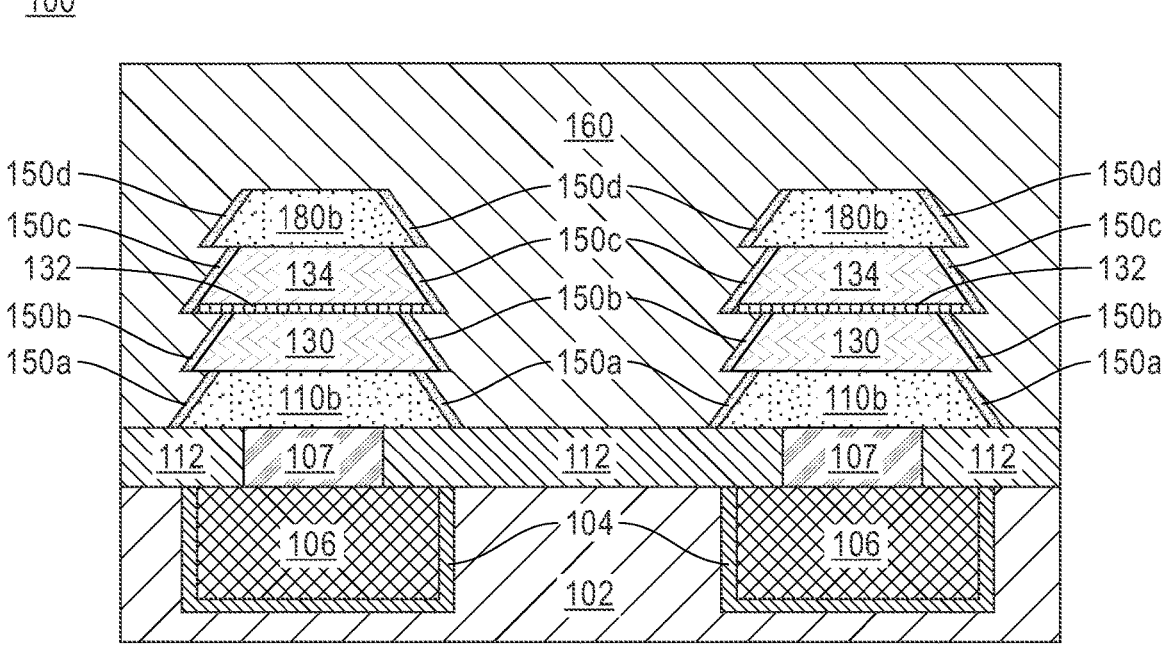
FIG. 32 is a cross-sectional view of the memory device after forming an interlevel dielectric layer, according to an embodiment of the present disclosure.

The process continues by depositing an interlevel dielectric filling layer to fill spaces between top electrodes 180b, as depicted in FIG. 32. As mentioned above, for ease of illustration, the deposited interlevel dielectric filling layer will be continued to be referred as second dielectric layer 160 since it is made of substantially the same materials.

Figure 33:
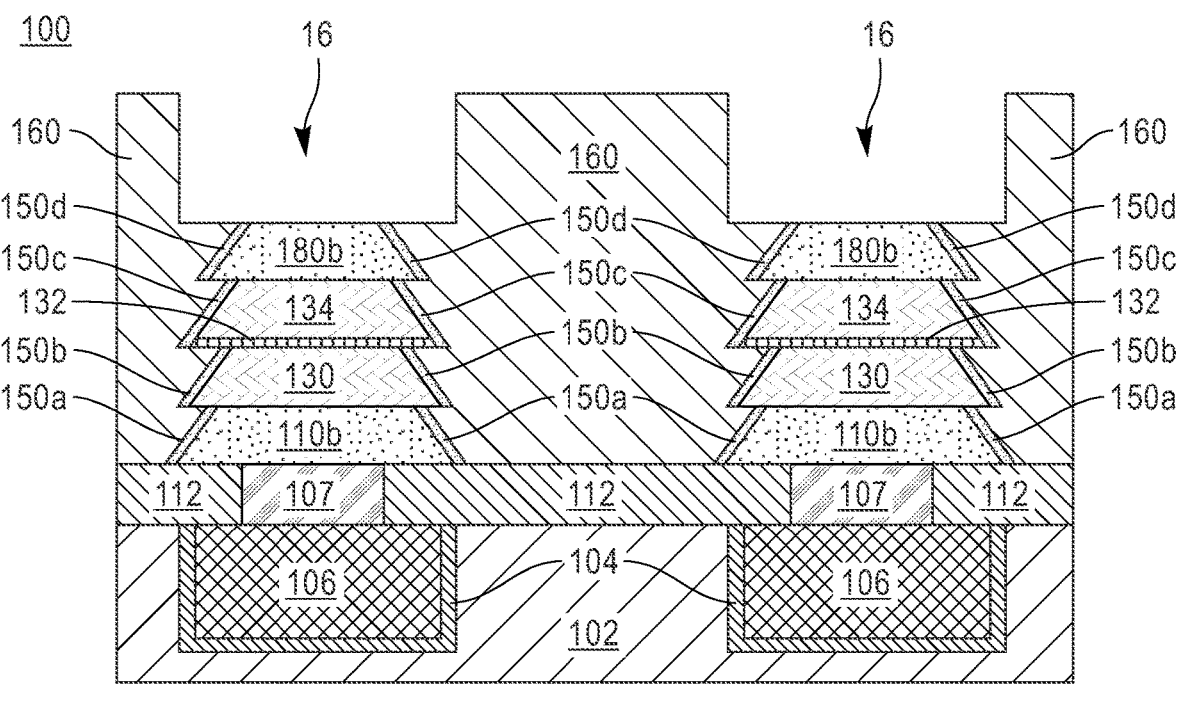
FIG. 33 is a cross-sectional view of the memory device after top contact patterning, according to an embodiment of the present disclosure.
Figure 34:
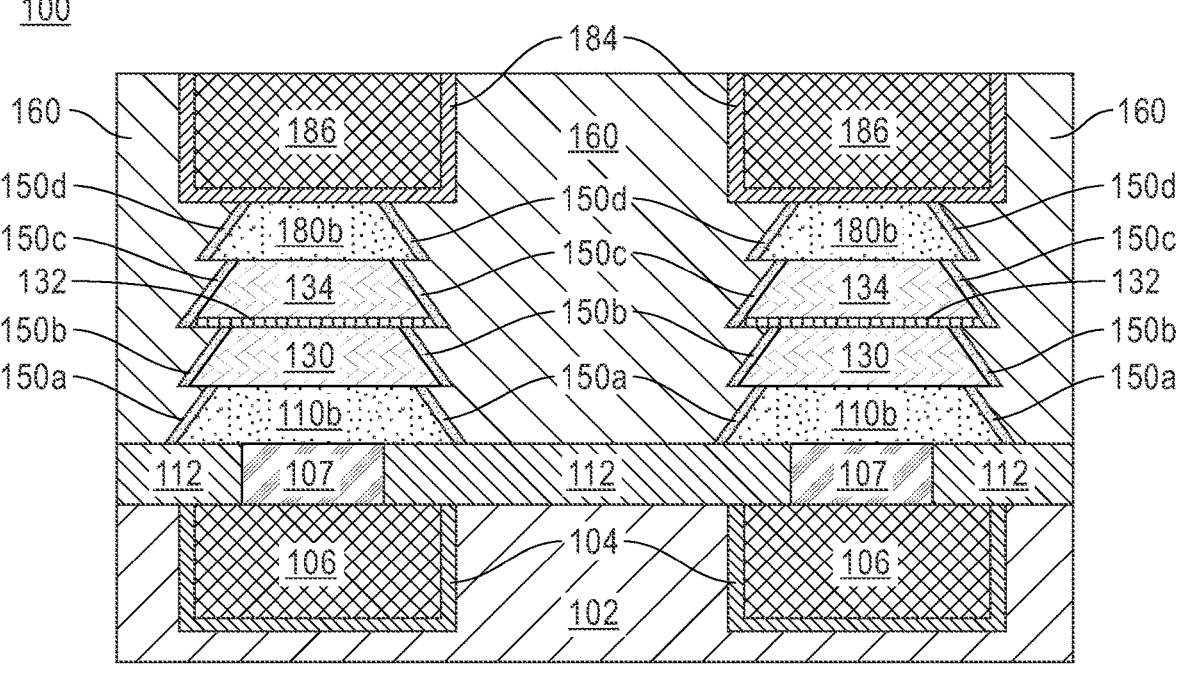
FIG. 34 is a cross-sectional view of the memory device after top contact metallization, according to an embodiment of the present disclosure.

Referring now to FIGS. 33-34 simultaneously, cross-sectional views of the memory device 100 are shown depicting operational steps for forming second conductive structures 186, according to an embodiment of the present disclosure.

In the depicted embodiment, top contact patterning can be performed on the second dielectric layer 160 in accordance with typical techniques. For example, top contact patterning can be conducted using a dual damascene technique by which trenches 16 are formed in the second dielectric layer 160 and subsequently filled with a conductive interconnect material, as will be described in detail below. As depicted in FIG. 33, the trenches 16 expose uppermost surfaces of the top electrodes 180b.

With reference now to FIG. 34, the process continues by forming the second conductive structures 186 which includes depositing a conductive interconnect material within the trenches 16 (FIG. 33). In one or more embodiments, a second diffusion barrier liner 184 can be formed prior to depositing the conductive interconnect material. In such embodiments, the second diffusion barrier liner 184 can be formed on a bottom surface and sidewalls of the second conductive structures 186, as shown in the figures.

Similar to the first conductive structures 106, the second conductive structures 186 may be composed of a conductive interconnect material such as Cu, Al, or W, while the second barrier liner 184 may include Ta, TaN, Ti, TiN, Ru, RuN, RuTa, RuTaN, W, or WN. The conductive interconnect material may be formed using a filling technique such as electroplating, electroless plating, chemical vapor deposition, physical vapor deposition or a combination of methods. A seed layer (not shown) may optionally be deposited prior to filling the trench using an electroplating technique. In one or more embodiments, a planarization process is conducted after forming the second conductive structures 186.

Accordingly, the memory device 100, as configured in FIG. 34, includes each of the MTJ pillars 12 (FIG. 25) being located between, and electrically connected to, the bottom electrode 110*b* and the top electrode 180*b*. Moreover, each MTJ pillar 12 (FIG. 25) includes a plurality of device layers vertically stacked above the bottom electrode with each of the plurality of device layers, the top electrode, and the bottom electrode being formed at a first bevel angle for providing beveled sidewalls that enable low aspect-ratio features for reducing void formation during deposition of interlevel dielectrics. In the proposed embodiments, a width of a bottommost portion of each of the plurality of device layers in the MTJ pillar 12 (FIG. 25) is greater than a width of a topmost portion of each preceding device layer, as depicted in FIG. 34. More particularly, a width of a bottommost portion of the magnetic reference layer 130 is greater than a width of topmost portion of the bottom electrode 110*b*, a width of a bottommost portion of the tunnel barrier layer 132 is greater than a width of a topmost portion of the magnetic reference layer 130, a width of a bottommost portion of the magnetic free layer 134 is greater than a width of a topmost portion of the tunnel barrier layer 132, and a width of a bottommost portion of the top electrode 180*b* is greater than a width of a topmost portion of the magnetic free layer 134. This sequence of vertically stacked beveled layers are formed with substantially the same bevel or slope angle such that the stack of device layers (i.e., the magnetic reference layer 130, tunnel barrier layer 132, and magnetic free layer 134) includes symmetrical sloping surfaces at an edge or corner of each device layer for reducing an aspect-ratio of the MTJ pillars 12 (FIG. 25).

Therefore, embodiments of the present disclosure, provide a memory device 100 having beveled sidewalls that addresses poor dielectric fill (voiding) concerns. The proposed memory device 100 including individually beveled device layers provides low aspect-ratio features prior to deposition of interlevel dielectrics which enables void-free interlevel dielectric fill, thereby preventing shorting between MTJ top contacts.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Spatially relative terms, such as "inner," "outer," "beneath," "below," "lower," "above," "upper," "top," "bottom," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory device, comprising:
    a magnetic tunnel junction pillar located between, and electrically connected to, a bottom electrode and a top electrode, the magnetic tunnel junction pillar including a plurality of device layers vertically stacked above the bottom electrode, each of the plurality of device layers, the top electrode, and the bottom electrode being at a first bevel angle;

a bottommost portion of each of the plurality of device layers in the magnetic tunnel junction pillar having a width that is greater than a width of a topmost portion of each preceding device layer; and an encapsulation layer disposed along opposite sidewalls of the top electrode, opposite sidewalls of the bottom electrode, and opposite sidewalls of each of the plurality of device layers, wherein the plurality of device layers further comprises:

a magnetic reference layer disposed above the bottom electrode, the magnetic reference layer including first beveled sidewalls comprising a first positive taper profile, a tunnel barrier layer disposed above the magnetic reference layer, the tunnel barrier layer including second beveled sidewalls comprising a second positive taper profile, and a magnetic free layer disposed above the tunnel barrier layer, the magnetic free layer including third beveled sidewalls comprising a third positive taper profile, and wherein the bottommost portion of each of the plurality of device layers being greater than the topmost portion of each preceding device layer further comprises:

a bottommost portion of the magnetic reference layer being greater than a topmost portion of the bottom electrode, a bottommost portion of the tunnel barrier layer being greater than a topmost portion of the magnetic reference layer, a bottommost portion of the magnetic free layer being greater than a topmost portion of the tunnel barrier layer, and a bottommost portion of the top electrode being greater than a topmost portion of the magnetic free layer.

2. The memory device of claim 1, wherein the top electrode includes fourth beveled sidewalls comprising a fourth positive taper profile, and the bottom electrode includes fifth beveled sidewalls comprising a fifth positive taper profile.

3. The memory device of claim 1, wherein the encapsulation layer disposed along opposite sidewalls of the top electrode and opposite sidewalls of the bottom electrode includes at least one of a first nitride material and a metal-oxide material.

4. The memory device of claim 3, wherein the first nitride material comprises SiN, and the metal-oxide material comprises at least one of $RuO_2$ and $IrO_2$.

5. The memory device of claim 1, wherein the encapsulation layer disposed along the opposite sidewalls of each of the plurality of device layers comprises a second nitride material disposed along opposite sidewalls of the magnetic reference layer, opposite sidewalls of the tunnel barrier layer, and opposite sidewalls of the magnetic free layer.

6. The memory device of claim 5, wherein the second nitride material comprises SiN.

7. The memory device of claim 5, wherein the encapsulation layer disposed along opposite sidewalls of each of the plurality of device layers comprises an oxynitride material disposed along the opposite sidewalls of the magnetic reference layer, and the second nitride material disposed along the opposite sidewalls of the tunnel barrier layer, and the opposite sidewalls of the magnetic free layer.

8. The memory device of claim 7, wherein the oxynitride material comprises AlON.

9. A method of forming a memory device, comprising:

forming a magnetic tunnel junction pillar between, and electrically connected to, a bottom electrode and a top electrode, the magnetic tunnel junction pillar including a plurality of device layers vertically stacked above the bottom electrode, each of the plurality of device layers, the top electrode, and the bottom electrode being at a first bevel angle, wherein a bottommost portion of each of the plurality of device layers in the magnetic tunnel junction pillar has a width that is greater than a width of a topmost portion of each preceding device layer; and forming an encapsulation layer along opposite sidewalls of the top electrode, opposite sidewalls of the bottom electrode, and opposite sidewalls of each of the plurality of device layers, wherein forming the magnetic tunnel junction pillar including the plurality of device layers further comprises:

forming a magnetic reference layer above the bottom electrode, the magnetic reference layer including first beveled sidewalls comprising a first positive taper profile;

forming a tunnel barrier layer above the magnetic reference layer, the tunnel barrier layer including second beveled sidewalls comprising a second positive taper profile; and forming a magnetic free layer above the tunnel barrier layer, the magnetic free layer including third beveled sidewalls comprising a third positive taper profile, and wherein the bottommost portion of each of the plurality of device layers being greater than the topmost portion of each preceding device layer further comprises:

a bottommost portion of the magnetic reference layer being greater than a topmost portion of the bottom electrode, a bottommost portion of the tunnel barrier layer being greater than a topmost portion of the magnetic reference layer, a bottommost portion of the magnetic free layer being greater than a topmost portion of the tunnel barrier layer, and a bottommost portion of the top electrode being greater than a topmost portion of the magnetic free layer.

10. The method of claim 9, wherein the top electrode includes fourth beveled sidewalls comprising a fourth positive taper profile, and the bottom electrode includes fifth beveled sidewalls comprising a fifth positive taper profile.

11. The method of claim 9, wherein the encapsulation layer along opposite sidewalls of the top electrode and the opposite sidewalls of the bottom electrode comprises at least one of a first nitride material and a metal-oxide material.

12. The method of claim 11, wherein the first nitride material comprises SiN, and the metal-oxide material comprises at least one of $RuO_2$ and $IrO_2$.

13. The method of claim 9, wherein the encapsulation layer along the opposite sidewalls of each of the plurality of device layers comprises a second nitride material disposed along opposite sidewalls of the magnetic reference layer, opposite sidewalls of the tunnel barrier layer, and opposite sidewalls of the magnetic free layer.

14. The method of claim 13, wherein the second nitride material comprises SiN.

15. The method of claim 13, wherein the encapsulation layer along opposite sidewalls of each of the plurality of device layers comprises an oxynitride material along the opposite sidewalls of the magnetic reference layer, and the second nitride material along opposite sidewalls of the 5 tunnel barrier layer, and the opposite sidewalls of the magnetic free layer.

16. The method of claim 15, wherein the oxynitride material comprises AlON.

\* \* \* \* \* 10